(12) United States Patent
Rouh et al.

(10) Patent No.: US 9,368,586 B2
(45) Date of Patent: Jun. 14, 2016

(54) TRANSISTOR WITH RECESS GATE AND METHOD FOR FABRICATING THE SAME

(71) Applicant: SK hynix Inc., Gyeonggi-do (KR)

(72) Inventors: Kyong-Bong Rouh, Gyeonggi-do (KR); Yong-Seok Eun, Gyeonggi-do (KR); Mi-Ri Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 46 days.

(21) Appl. No.: 13/719,808

(22) Filed: Dec. 19, 2012

(65) Prior Publication Data

US 2014/0001541 A1    Jan. 2, 2014

(30) Foreign Application Priority Data

Jun. 29, 2012  (KR) .................. 10-2012-0071139

(51) Int. Cl.
*H01L 29/40*     (2006.01)
*H01L 29/423*    (2006.01)
*H01L 21/8238*   (2006.01)
*H01L 21/28*     (2006.01)
*H01L 21/3215*   (2006.01)
*H01L 29/49*     (2006.01)
*H01L 29/51*     (2006.01)

(52) U.S. Cl.
CPC ........ *H01L 29/401* (2013.01); *H01L 21/28061* (2013.01); *H01L 21/32155* (2013.01); *H01L 21/82385* (2013.01); *H01L 21/823828* (2013.01); *H01L 29/4236* (2013.01); *H01L 29/4925* (2013.01); *H01L 29/517* (2013.01)

(58) Field of Classification Search
CPC ............................. H01L 21/22; H01L 29/16
USPC .................. 438/554, 558, 560, 561
See application file for complete search history.

(56) References Cited

U.S. PATENT DOCUMENTS

| | | | | |
|---|---|---|---|---|
| 4,180,596 A | * | 12/1979 | Crowder et al. | 438/664 |
| 4,676,847 A | * | 6/1987 | Lin | 438/564 |
| 4,782,033 A | * | 11/1988 | Gierisch et al. | 438/199 |
| 5,885,877 A | | 3/1999 | Gardner et al. | |
| 5,891,794 A | | 4/1999 | Ibok | |
| 6,174,807 B1 | * | 1/2001 | Kizilyalli et al. | 438/655 |
| 6,265,259 B1 | * | 7/2001 | Wu | 438/232 |
| 6,770,551 B2 | * | 8/2004 | Sun | 438/592 |
| 6,911,384 B2 | * | 6/2005 | Dokumaci et al. | 438/592 |
| 2005/0167741 A1 | * | 8/2005 | Divakaruni et al. | 257/328 |
| 2008/0237661 A1 | * | 10/2008 | Ranade et al. | 257/288 |
| 2008/0246094 A1 | | 10/2008 | Liaw et al. | |
| 2008/0268628 A1 | * | 10/2008 | Kohli et al. | 438/542 |

FOREIGN PATENT DOCUMENTS

| | | |
|---|---|---|
| KR | 1020040090476 | 10/2004 |
| KR | 100586554 | 6/2006 |

(Continued)

*Primary Examiner* — Fernando L Toledo
*Assistant Examiner* — Valerie N Newton
(74) *Attorney, Agent, or Firm* — IP & T Group LLP

(57) ABSTRACT

A transistor including a recessed gate structure having improved doping characteristics and a method for forming such a transistor. The transistor includes a recess in a semiconductor substrate, where the recess is filled with a recessed gate structure including an impurity doped layer and a layer doped with a capture species. The capture species accumulates the impurity and diffuses the impurity to other layers of the recessed gate structure.

26 Claims, 26 Drawing Sheets

(56) References Cited

FOREIGN PATENT DOCUMENTS

| KR | 1020070027123 | 3/2007 |
|----|---------------|--------|
| KR | 1020070069912 | 7/2007 |
| KR | 1020090044550 | 5/2009 |
| KR | 1020100085598 | 7/2010 |
| KR | 1020110023080 | 3/2011 |
| KR | 1020110077963 | 7/2011 |

* cited by examiner

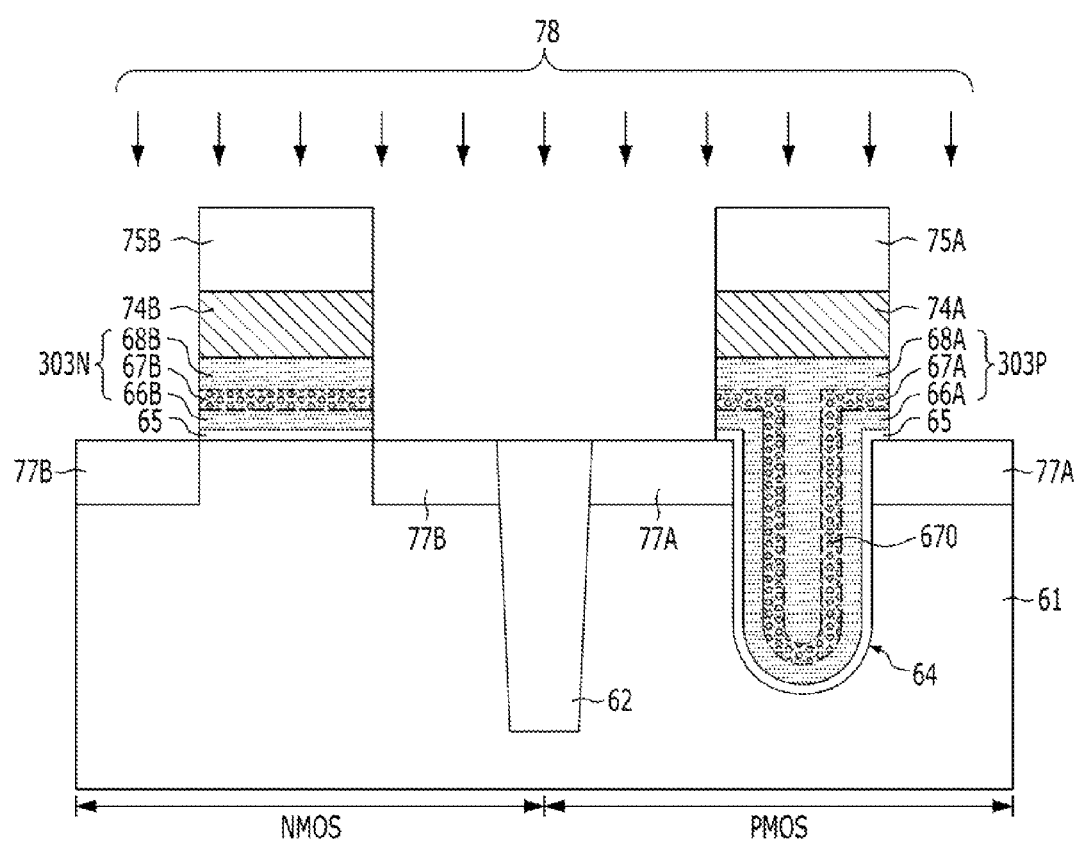

TRANSISTOR WITH RECESS GATE AND METHOD FOR FABRICATING THE SAME

CROSS-REFERENCE TO RELATED APPLICATIONS

The present application claims priority of Korean Patent Application No. 10-2012-0071139, filed on Jun. 29, 2012, which is incorporated herein by reference in its entirety.

BACKGROUND

1. Field

Exemplary embodiments of the present invention relate to a semiconductor device, and more particularly, to a transistor with a recess gate and a method for fabricating the same.

2. Description of the Related Art

As the degree of integration of a semiconductor memory device, such as a DRAM, increases, an area occupied by a transistor gradually decreases. Therefore, as the channel length of the transistor is shortened, a short channel effect occurs. In particular, if the short channel effect occurs in a cell transistor, which is adopted in the memory cell of a DRAM, leakage current of the memory cell increases, and a refresh characteristic deteriorates. According to this fact, a recess gate structure capable of suppressing the short channel effect, even when the degree of integration of a DRAM increases, has been suggested.

Recently, a method of applying the recess gate structure to improve driving performance of a transistor formed in a peripheral region has been suggested.

FIG. 1 is a cross-sectional view illustrating a conventional transistor with a conventional recess gate structure.

Referring to FIG. 1, a recess 12 is defined in a semiconductor substrate 11. A gate dielectric layer 13 is formed on a surface that defines the recess 12. A recess gate structure, including a silicon electrode 14, is formed on the gate dielectric layer 13 and fills the recess 12. A metal electrode 15 is formed on the silicon electrode 14 and a gate hard mask layer 16 is formed on the metal electrode 15. Source/drain regions 17 are formed in the semiconductor substrate 11 on both sides of the recess gate structure.

In FIG. 1, the silicon electrode 14 includes polysilicon and is doped with an impurity to have a conductivity. For example, after depositing undoped polysilicon to fill the recess 12, the impurity is doped. The impurity may include a N-type impurities or a P-type impurity, depending on a desired type of transistor. For example, an NMOSFET includes N-type polysilicon while a PMOSFET includes P-type polysilicon.

FIGS. 2A and 2B are views illustrating impurity doping methods for a silicon electrode according to the conventional art. FIG. 2A illustrates an ion beam implantation method, and FIG. 2B illustrates a plasma doping method.

When doping impurities using the ion beam implantation method, ion beam implantation method may be performed by setting a projection range Rp to a deep zone of a recess as indicated by the reference symbol ①. However, in the ion beam implantation method, a problem may be caused in that a penetration phenomenon is likely to occur as indicated by the reference symbols ② and ③.

In the plasma doping (PLAD) method, as is generally known in the art, the surface of a silicon electrode has a greatest doping concentration and impurities are diffused downward. Therefore, as the height of the silicon electrodes increases, doping efficiency abruptly decreases. Therefore, in the recess gate structure, while doping may be sufficiently performed on the surface and up to an intermediate zone ④, it is difficult to sufficiently perform doping up to a deep zone ⑤ of a recess.

SUMMARY

Embodiments of the present invention are directed to a transistor having an improved doping efficiency of a recess gate structure, and a method for fabricating the same.

In accordance with an embodiment of the present invention, a method for fabricating a transistor may include: forming a recess in a semiconductor substrate, forming a gate dielectric layer over the semiconductor substrate, forming a gate conductive layer over the gate dielectric layer, the gate conductive layer including a layer that functions as a capture zone, doping the gate conductive layer with an impurity, wherein the impurity is accumulated in the capture zone, and diffusing the impurity by performing annealing.

In accordance with another embodiment of the present invention, a method for fabricating a transistor may include: forming a recess in a semiconductor substrate, forming a gate dielectric layer over the semiconductor substrate, forming, over the gate dielectric layer, a gate conductive layer including a lower layer, an intermediate layer, and an upper layer, wherein the intermediate layer contains a capture species, doping the gate conductive layer with a first impurity, wherein the first impurity is accumulated in the intermediate layer, diffusing the first impurity by performing annealing.

In accordance with yet another embodiment of the present invention, a method for fabricating a transistor may include: forming recesses in first and second regions of a semiconductor substrate, forming a gate dielectric layer over the semiconductor substrate having the recesses, forming, over the gate dielectric layer, a gate conductive layer in the first region and in the second region, the gate conductive layer including a lower layer, an intermediate layer, and an upper layer, wherein the intermediate layer contains a capture species, doping the gate conductive layer in the first region with a first impurity, and doping the gate conductive layer in the second region with a second impurity that is different from the first impurity, wherein the first impurity and the second impurity are accumulated in the intermediate layer in the first region and in the second region, respectively, and diffusing the first impurity and the second impurity in the first region and in the second region, respectively, by performing annealing.

In accordance with still another embodiment of the present invention, a method for fabricating a transistor may include: forming a gate dielectric layer over a semiconductor substrate that includes a first region that defines a recess and a second region having a planar surface, forming, over the gate dielectric layer, a gate conductive layer in the first region and in the second region, the gate conductive layer including a lower layer, an intermediate layer, and an upper layer, wherein the intermediate layer contains a capture species, doping the gate conductive layer in the first region with a first impurity, and doping the gate conductive layer in the second region with a second impurity that is different from the first impurity, wherein the first impurity and the second impurity are accumulated in the intermediate layer in the first region and in the second region, respectively, and diffusing the first impurity and the second impurity in the first region and in the second region, respectively, by performing annealing.

In accordance with yet still another embodiment of the present invention, a semiconductor substrate including a plurality of transistor regions, a recess defined in at least one of the plurality of transistor regions, a gate dielectric layer formed over the semiconductor substrate having the recess, and a recess gate structure, formed in the recess and over the gate dielectric layer, the recess gate structure including a lower layer, an intermediate layer, and an upper layer, wherein the intermediate layer contains a capture species to accumulate an impurity doped into the recess gate structure.

BRIEF DESCRIPTION OF THE DRAWINGS

FIGS. 8A to 8H are views illustrating an exemplary method for forming the transistor in accordance with the third embodiment of the present invention.

DETAILED DESCRIPTION

Figure 1:
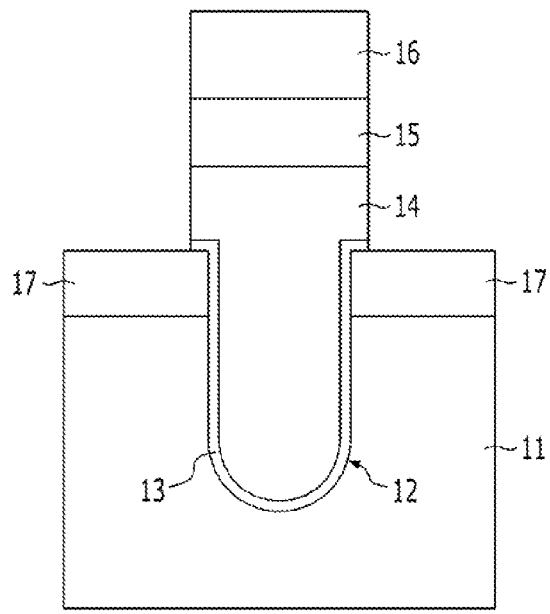
FIG. 1 is a view illustrating a conventional transistor with a conventional recess gate structure.
Figure 2A:
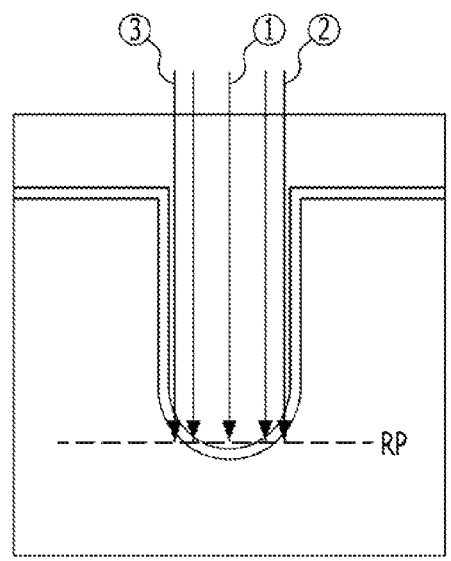
FIGS. 2A and 2B are views illustrating conventional impurity doping methods for a silicon electrode.
Figure 2B:
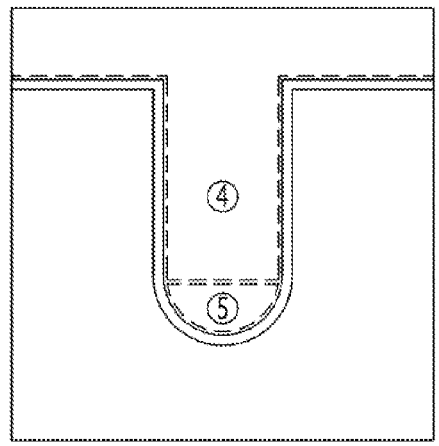

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 3A:
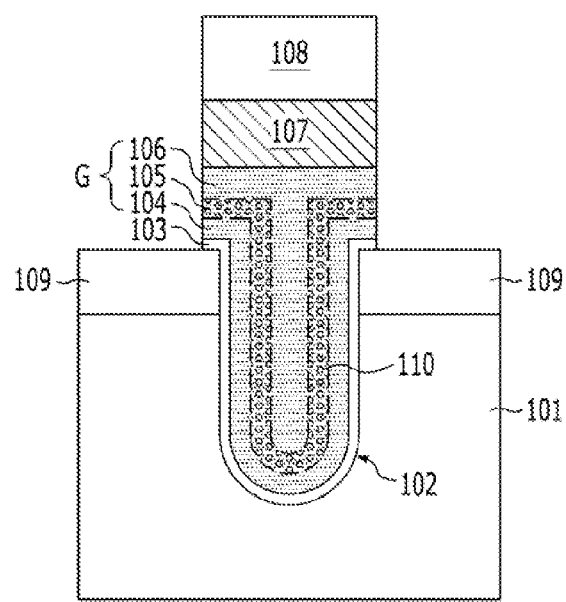
FIG. 3A is a view illustrating a transistor with a recess gate structure in accordance with a first embodiment of the present invention.

FIG. 3A is a view illustrating a transistor with a recess gate structure in accordance with a first embodiment of the present invention.

Referring to FIG. 3A, a recess 102 is defined in a semiconductor substrate 101. A gate dielectric layer 103 is formed on the surface of the semiconductor substrate 101 that defines the recess 102. A silicon-containing electrode G is formed on the gate dielectric layer 103 to fill the recess 102. The silicon-containing electrode G may project out of the surface of the semiconductor substrate 101 while filling the recess 102. A metal electrode 107 and a gate hard mask layer 108 are formed on the silicon-containing electrode G. Source/drain regions 109 are formed in the semiconductor substrate 101 on both sides of the silicon-containing electrode G.

In FIG. 3A, as the silicon-containing electrode G, a lower layer, an intermediate layer and an upper layer may be stacked. For example, the lower layer, the intermediate layer and the upper layer respectively include a first silicon layer 104, a second silicon layer 105 and a third silicon layer 106. The first silicon layer 104 and the second silicon layer 105 are conformally formed on the gate dielectric layer 103, and the third silicon layer 106 fills a portion of the recess 102 defined by the second silicon layer 105. The first to third silicon layers 104, 105, and 106 may include polysilicon layers. The first to third silicon layers 104, 105, and 106 may be polysilicon layers that may be uniformly doped with an impurity, such as boron or phosphorus. A capture species 110 is contained in the second silicon layer 105. The capture species 110 may include carbon or nitrogen, or a mixture of carbon and nitrogen. In the case of a mixture of carbon and nitrogen, the second silicon layer 105 may be formed by stacking a nitrogen-containing zone and a carbon-containing zone. The second silicon layer 105 is positioned at least in the recess 102. The second silicon layer 105 may be formed parallel to the surface of the substrate 101 that defines the recess 102. That is, the second silicon layer 105 may be formed at a uniform distance from the surface of the substrate 101 that defines the recess 102.

Figure 3B:
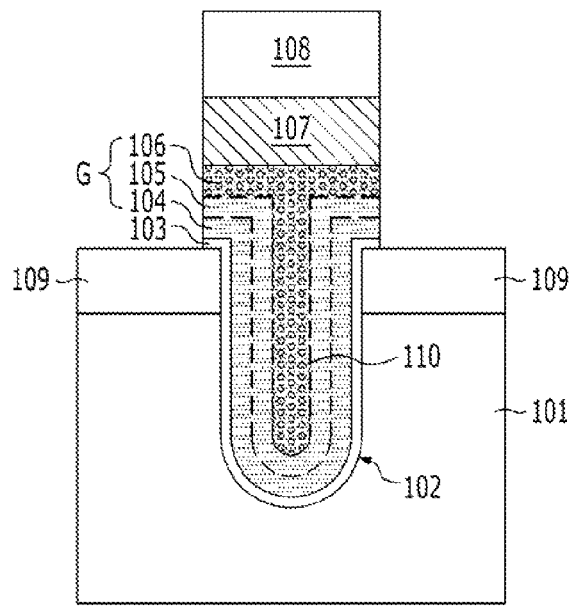
FIG. 3B is a view illustrating a transistor with a recess gate structure according to a variation of the first embodiment of the present invention.

FIG. 3B is a view illustrating a transistor with a recess gate structure according to a variation of the first embodiment of the present invention. FIG. 3B illustrates the case where the capture species 110 is included in the third silicon layer 106.

Figure 3C:
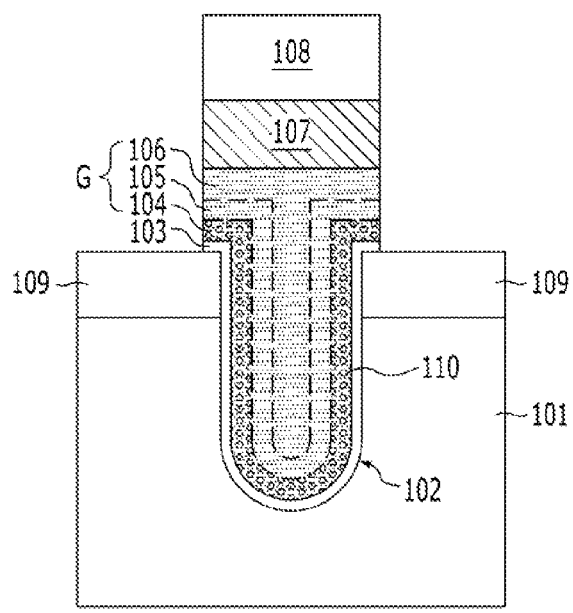
FIG. 3C is a view illustrating a transistor with a recess gate structure according to another variation of the first embodiment of the present invention.

FIG. 3C is a view illustrating a transistor with a recess gate structure according to another variation of the first embodiment of the present invention. FIG. 3C illustrates the case where the capture species 110 is included in the first silicon layer 104.

Figure 3D:
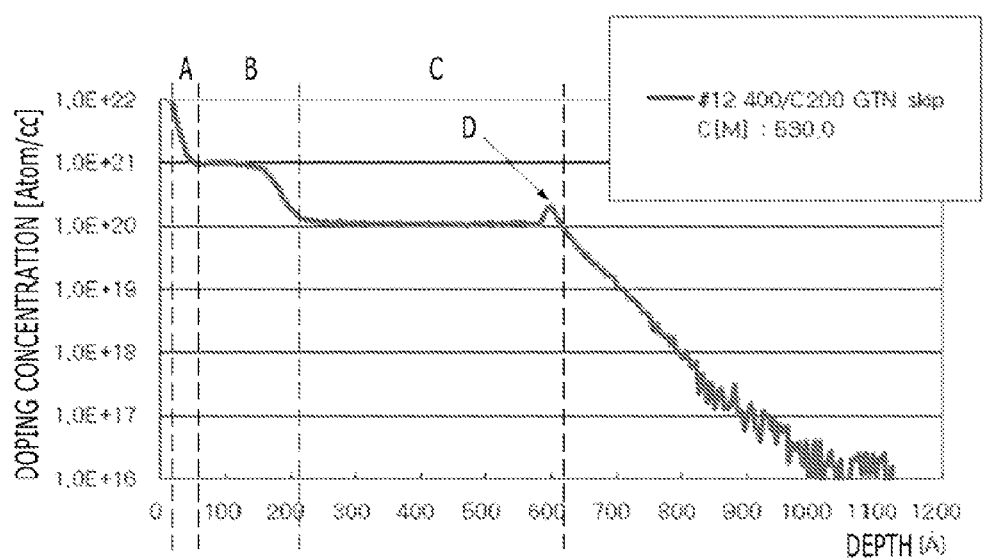
FIG. 3D is a graph explaining an impurity accumulation effect by a capture species in accordance with the first embodiment of the present invention.

FIG. 3D is a graph explaining an impurity accumulation effect by a capture species in accordance with the first embodiment of the present invention.

In FIG. 3D, the horizontal axis shows depth, and the vertical axis shows boron doping concentration. A zone, B zone and C zone represent zones by thicknesses of a silicon-containing electrode. For example, A zone may correspond to the third silicon layer 106, B zone may correspond to the second silicon layer 105, and C zone may correspond to the first silicon layer 104. FIG. 3D shows a result when the capture species is contained in the intermediate layer.

Referring to FIG. 3D, boron has a highest doping concentration in the A zone and a lowest doping concentration in the C zone. It can be seen that doping concentration is higher in the B zone containing the capture species than in the C zone. The reference symbol D designates a zone that adjoins the gate dielectric layer, and it can be seen that the doping concentration of boron abruptly increases. As will be described later in detail, this is because boron accumulated by the capture species continuously diffuses up to the D zone by annealing. In this way, since the doping concentration of boron may be increased in the D zone, the occurrence of a depletion phenomenon may be prevented. Moreover, because boron continuously diffuses through a subsequent process, the boron doping concentration of the silicon-containing electrode may be sufficiently secured at a deep zone of a recess.

FIGS. 4A to 4G are views illustrating an exemplary method for forming the transistor in accordance with the first embodiment of the present invention.

Figure 4A:
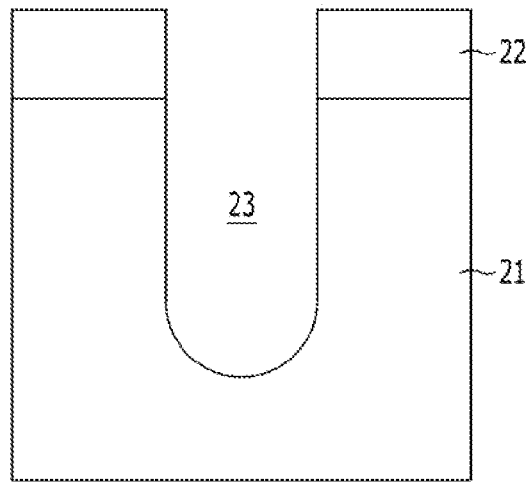
FIGS. 4A to 4G are views illustrating an exemplary method for forming the transistor in accordance with the first embodiment of the present invention.

Referring to FIG. 4A, a patterned hard mask layer 22 is formed on a semiconductor substrate 21. By etching a portion of the semiconductor substrate 21, using the hard mask layer 22 as an etch barrier, a recess 23 is defined. The semiconductor substrate 21 may include a silicon-containing substance. The semiconductor substrate 21 may include a silicon substrate or a silicon-germanium substrate. The hard mask layer 22 may include a silicon oxide, a silicon nitride, or a stack of a silicon oxide and a silicon nitride. Also, the hard mask layer 22 may include a substance with an etching selectivity when etching the semiconductor substrate 21. The recess 23 may have a depth, for example, of approximately 2000 Å that varies according to a channel length. The recess 23 may be defined by dry-etching the semiconductor substrate 21. Accordingly, the bottom of the recess 23 may have a rounded profile. While not shown, after defining the recess 23, an ion implantation of an impurity, for controlling a threshold voltage (hereinafter, referred to as "threshold voltage control ion implantation"), may be performed. In the threshold voltage control ion implantation, a suitable impurity may be selected for the channel of a transistor. Before the threshold voltage control ion implantation, a sacrificial layer (not shown) may be formed on a surface of the substrate 21 that defines the recess 23. By forming the sacrificial layer, it is possible to minimize damage caused by etching or any defects that are produced while defining the recess 23. The sacrificial layer may be formed using a thermal oxidation process and may be removed after the threshold voltage control ion implantation.

Figure 4B:
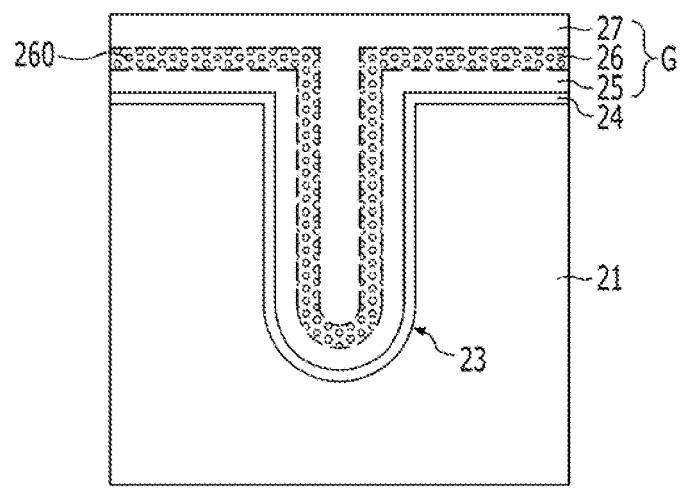

Referring to FIG. 4B, the hard mask layer 22 is removed. A gate dielectric layer 24 is formed on the entire surface of the semiconductor substrate 21 including the surface of the substrate 21 that defines the recess 23. The gate dielectric layer 24 may include a silicon oxide, a silicon nitride, or a high dielectric constant (high-k) substance. The gate dielectric layer 24 may be formed through thermal oxidation, plasma oxidation, atomic layer deposition (ALD), chemical vapor deposition (CVD), etc. Subsequently, the gate dielectric layer 24 may be nitridated. The high-k substance generally has a dielectric constant higher than the dielectric constant (of approximately 3.9) of a silicon oxide ($SiO_2$). The high-k substance is substantially thicker physically than the silicon oxide and has a lower equivalent oxide thickness (EOT) value than the silicon oxide. For example, the high-k substance may include a metal-containing substance such as a metal oxide or a metal silicate. The metal oxide may include an oxide containing a metal, such as hafnium (Hf), aluminum (Al), lanthanum (La), or zirconium (Zr). The metal oxide may include a hafnium oxide ($HfO_2$), an aluminum oxide ($Al_2O_3$), a lanthanum oxide ($LaO_2$), a zirconium oxide ($ZrO_2$), or a combination thereof. The metal silicate may include a silicate containing a metal such as hafnium (Hf) or zirconium (Zr). The metal silicate may include a hafnium silicate (HfSiO), a zirconium silicate (ZrSiO), or a combination thereof.

A process for forming the high-k substance may include any suitable deposition technology. For example, chemical vapor deposition (CVD), low-pressure CVD (LPCVD), plasma-enhanced CVD (PECVD), metal-organic CVD (MOCVD), atomic layer deposition (ALD), plasma-enhanced ALD (PEALD), and so forth may be used. In order to form a uniform thin film, plasma-enhanced ALD (PEALD) may be used. The high-k substance may subsequently be exposed to a nitridation process, such as a plasma nitridation process. Accordingly, nitrogen is implanted into the high-k substance. For example, in the case where the high-k substance is a hafnium silicate (HfSiO), a hafnium silicon oxynitride (HfSiON) is formed by the nitridation process. In this way, by implanting nitrogen into a metal silicate, a dielectric constant increases, and it is possible to suppress crystallization of the metal silicate in a subsequent thermal process.

A gate conductive layer is formed on the gate dielectric layer 24 to fill the recess 23. The gate conductive layer may include a silicon-containing layer G that is not doped with an impurity. The undoped silicon-containing layer G may include at least a capture species 260. An impurity is a substance for affording a conductivity, such as an N-type conductivity or a P-type conductivity, and the capture species 260 is a substance for capturing an impurity.

The entire thickness of the silicon-containing layer G may be divided into a lower zone, an intermediate zone, and an upper zone. The lower zone, the intermediate zone, and the upper zone may be defined into thicknesses or into multiple layers. For example, when the entire thickness of the silicon-containing layer G is approximately 2000 Å, a zone from the surface of the gate dielectric layer 24, formed on the surface of the substrate 21 that defines the recess 23, may have a thickness of approximately 500 Å and may be defined as the lower zone, a zone from the thickness of approximately 500 Å to the thickness of approximately 1500 Å may be defined as the intermediate zone, and a zone from the thickness of approximately 1500 Å to the thickness of approximately 2000 Å may be defined as the upper zone. Furthermore, the lower zone, the intermediate zone, and the upper zone of the silicon-containing layer G may each include a silicon layer. The silicon layers may be stacked in order of a lower layer, an intermediate layer, and an upper layer. For example, the silicon layers may include a first silicon layer 25, a second silicon layer 26, and a third silicon layer 27. The first silicon layer 25 may correspond to the lower zone, the second silicon layer 26 may correspond to the intermediate zone, and the third silicon layer 27 may correspond to the upper zone.

Hereafter, in the embodiment, it is assumed that the lower zone, the intermediate zone, and the upper zone of the silicon-containing layer G are defined by the first silicon layer 25, the second silicon layer 26, and the third silicon layer 27, respectively.

The term "undoped" is defined to mean not containing a conductive impurity. First, the first silicon layer 25 may include undoped silicon. For example, the first silicon layer 25 may include undoped polysilicon. The first silicon layer 25 may be conformally deposited to a thickness that does not fill the recess 23.

The second silicon layer 26 is formed on the first silicon layer 25. The second silicon layer 26 may be formed of undoped polysilicon in the same manner as the first silicon layer 25. Unlike the first silicon layer 25, the second silicon layer 26 may contain a capture species 260. The second silicon layer 26 may be formed continuously after depositing the first silicon layer 25. Also, the second silicon layer 26 may be deposited contiguous with the first silicon layer 25. The capture species 260 contained in the second silicon layer 26 may include carbon or nitrogen. The capture species 260 serves to capture and store an implanted or diffused impurity and diffuse the implanted or diffused impurity into a surrounding structure during a subsequent annealing. When forming the second silicon layer 26, the capture species 260 is doped into the second silicon layer 26 and second silicon layer 26 is deposited. Accordingly, the second silicon layer 26 is undoped polysilicon containing the capture species 260. If the concentration of the capture species 260, such as carbon and nitrogen is too high, the diffusion of the impurity may be suppressed. Therefore, the capture species 260 may have a concentration equal to or less than approximately $10^{10}$ atoms/cm³. The capture species 260 may be doped in situ when depositing the second silicon layer 26. When depositing the second silicon layer 26, a carbon-containing gas or a nitrogen-containing gas may be flowed in addition to a silicon source gas. The carbon-containing gas and the nitrogen-containing gas may be simultaneously flowed, and accordingly, the second silicon layer 26 may contain both carbon and nitrogen as the capture species 260. In another example, after forming a nitrogen-containing zone by first flowing the nitrogen-containing gas, a carbon-containing zone may be formed by flowing the carbon-containing gas.

The third silicon layer 7 is formed on the second silicon layer 26 to fill the recess 23. The third silicon layer 27 may be formed of the same substance as the first and second silicon layers 25 and 26. The third silicon layer 27 may include undoped silicon that is not doped with an impurity. For example, the third silicon layer 27 may include undoped polysilicon.

The first silicon layer 25, the second silicon layer 26 and the third silicon layer 27 may have the same thickness. Alternatively, the first silicon layer 25 and the third silicon layer 27 may have the same thickness and the second silicon layer 26 may thinner than the first and third silicon layers 25 and 27.

The third silicon layer 27 is planarized. The planarization may be carried out through etch-back or chemical mechanical polishing (CMP).

In this way, the silicon-containing layer G is formed as a substance that fills the recess 23. The silicon-containing layer G may include a multi-layered structure of undoped polysilicon, the multi-layered structure including the second silicon layer 26 that contains the capture species 260. The first to third silicon layers 25, 26, and 27 may be deposited through chemical vapor deposition (CVD), atomic layer deposition (ALD), etc.

The recess 23 is filled by sequentially depositing the first silicon layer 25, the second silicon layer 26, and the third silicon layer 27. Due to the fact that the second silicon layer 26, containing the capture species 260, is formed between the first silicon layer 25 and the third silicon layer 27, a sandwich structure is completed. It may be seen that the capture species 260 is contained in the intermediate zone of the silicon-containing layer G by such a sandwich structure. Accordingly, the second silicon layer 26, containing the capture species 260, becomes a capturing zone. The second silicon layer 26 is positioned at least in the recess 23. The second silicon layer 26 may be formed parallel to a surface of the substrate 21 that defines the recess 23. In other words, the second silicon layer 26 may be formed at a uniform distance from the surface of the recess 23. The first silicon layer 25 is positioned between the surface of the recess 23 and the second silicon layer 26.

Figure 4C:
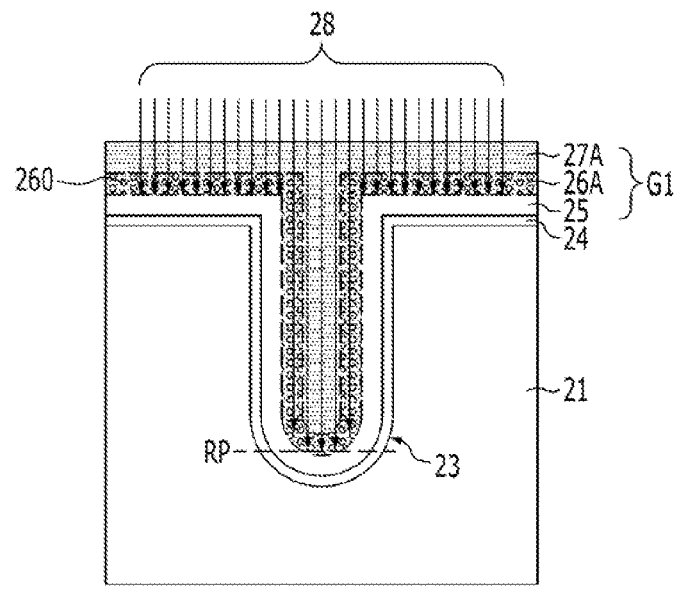

Referring to FIG. 4C, an impurity doping 28 is performed. Impurities, which are conductive, may include a P-type impurity or a N-type impurity. The P-type impurity may include boron. The N-type impurity may include phosphorus. The impurity doping 28 may use a plasma doping method or an implantation method. For example, $^{11}$B or $^{31}$P may be used as an impurity source.

By performing the impurity doping 28 in this way, an impurity is doped into the third silicon layer 27.

When the impurity is doped using the plasma doping method, as energy is increased, a substantial concentration change on a surface does not occur, and only a slope of a concentration distribution based on a doping depth changes so that the doping depth gradually increases. Thus, in the case of increasing energy, the impurity doping concentration of the third silicon layer 27 may be increased in a deep zone of the recess 23. Furthermore, the impurity may be diffused to the second silicon layer 26 underlying the third silicon layer 27. An impurity diffused in this way is captured by the capture species 260 that is contained in the second silicon layer 26, and are accumulated in the second silicon layer 26.

In the case of using the implantation method, the impurity doping 28 may be performed by setting an Rp (projection range) to a deep zone of the recess 23. Rp is a value that indicates the maximum concentration at a specified depth. According to this fact, impurities are doped into not only the third silicon layer 27 but also the second silicon layer 26. In particular, when using the implantation method, as penetration is suppressed by the capture species 260 contained in the second silicon layer 26, the impurity is accumulated in the second silicon layer 26. Since a penetration phenomenon is suppressed by the capture species 260, ion implantation energy may be sufficiently increased. Also, a subsequent thermal process may be performed at a high temperature. Since carbon or nitrogen, which may be used as the capture species 260, can suppress diffusion of the impurity, the impurity that diffuses from the third silicon layer 27 may be captured, and it is possible to prevent diffusion of the impurity to structures (including the first silicon layer 25, the gate dielectric layer 24 and the surface of the recess 23) below the second silicon layer 26. The diffusion suppressing effect is possible when carbon or nitrogen is contained in a small amount. In the case where carbon or nitrogen are contained in an excessive amount, since the diffusion of impurity from the third silicon layer 27 is blocked, it is difficult to capture the impurity in the second silicon layer 26. The diffused impurity is an impurity that is diffused through the impurity doping 28 by the plasma doping method or the implantation method.

In this way, by forming the second silicon layer 26, containing the capture species 260 in the silicon-containing layer G, an impurity may be accumulated in the second silicon layer 26 when using the plasma doping method or the implantation method. Furthermore, it is possible to capture and accumulate the impurity diffused to the second silicon layer 26 and suppress the accumulated impurity from being diffused to the underlying structures.

By the impurity doping 28, the third silicon layer 27 becomes a doped third silicon layer 27A and the second silicon layer 26 becomes a doped second silicon layer 26A. The doped third silicon layer 27A or the doped second silicon layer 26A may be doped with phosphorus or boron. The doped second silicon layer 26A contains the capture species 260 in addition to the phosphorus or the boron. Therefore, a partially doped silicon-containing layer G1, including the doped third silicon layer 27A, the doped second silicon layer 26A and the undoped first silicon layer 25, is formed.

Figure 4D:
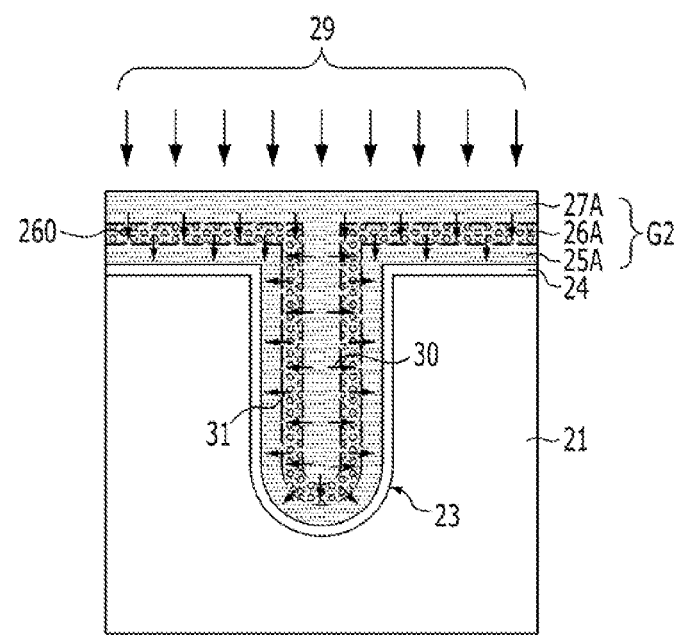

Referring to FIG. 4D, a first annealing 29 is performed. The first annealing 29 may include rapid thermal annealing. By the first annealing 29, an impurity is diffused from the doped third silicon layer 27A into the doped second silicon layer 26A (see the reference numeral 30). Moreover, the impurity accumulated in the doped second silicon layer 26A is diffused to the first silicon layer 25 (see the reference numeral 31). The diffusion designated by the reference numerals 30 and 31 will be referred to as "primary diffusion." By the primary diffusion, the impurity is accumulated in the doped second silicon layer 26A, and the accumulated impurity is diffused into the first silicon layer 25, thus doping the first silicon layer 25.

By sequentially performing the impurity doping 28 and the first annealing 29 as described above, all the first to third silicon layers are in doped states, forming a doped silicon-containing layer G2 in the recess 23. The doped silicon-containing layer G2 includes the doped first silicon layer 25A, the doped second silicon layer 26A, and the doped third silicon layer 27A. The doped second silicon layer 26A is doped with the impurity and includes the capture species 260. The doped first silicon layer 25A and the doped third silicon layer 27A are only doped with impurities, and are not doped with the capture species. In the case where the doped silicon-containing layer G2 is polysilicon, it becomes a P-type doped polysilicon layer or an N-type doped polysilicon layer depending on the type of impurity used for doping.

Figure 4E:
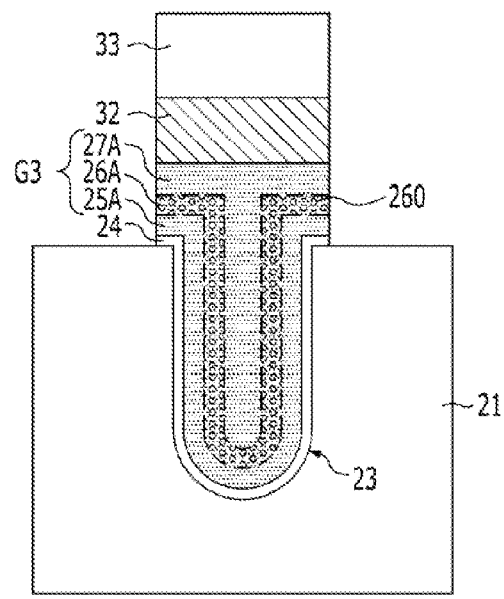

Referring to FIG. 4E, after forming a metal layer and a gate hard mask layer on the doped silicon-containing layer G2, a gate etching process is performed. A recess gate structure in which a doped silicon-containing electrode G3 (formed from doped polysilicon layer G2), a metal electrode 32, and a gate hard mask layer 33 are stacked, is formed. The metal electrode 32 may include a low resistance substance. For example, the metal electrode 32 may include tungsten or a titanium nitride layer. The gate hard mask layer 33 may include a silicon nitride. The doped silicon-containing electrode G3, formed in the recess gate structure, extends into the recess 23. While not shown, a gate spacer process may be performed after the gate etching process. As gate spacers, a silicon oxide, a silicon nitride, or so forth may be used.

Figure 4F:
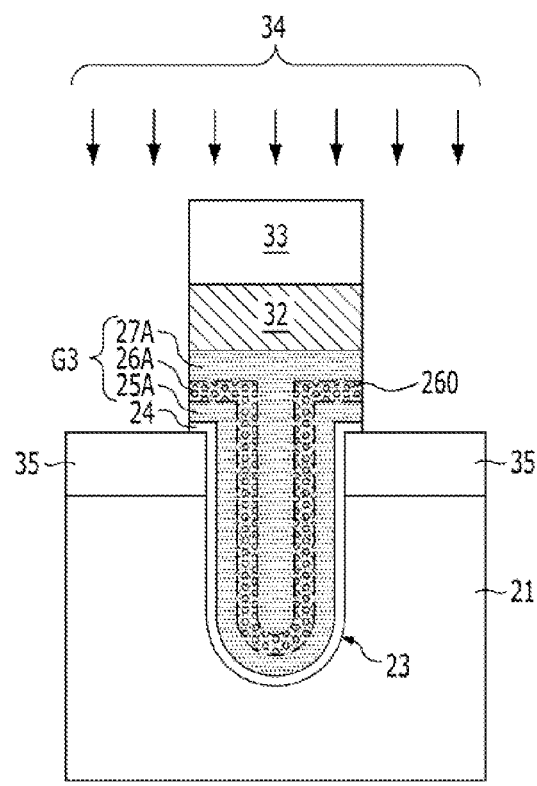
Figure 4G:
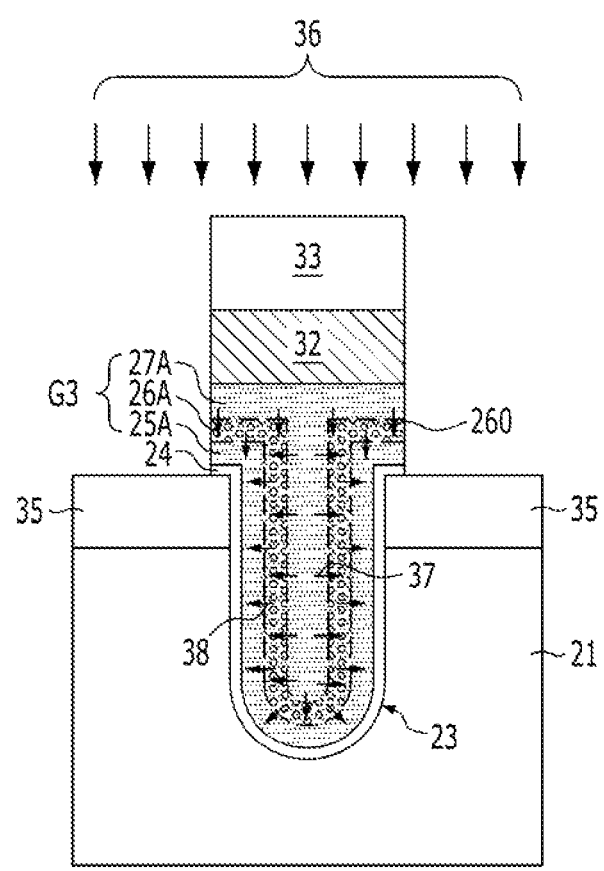

Referring to FIGS. 4F and 4G, an impurity ion implantation 34 and a second annealing 36 for forming source/drain regions 35 are performed. The second annealing 36 may include rapid thermal annealing. The second annealing 36 activates impurities implanted into the source/drain regions 35.

When performing the second annealing 36, as described above, the impurity is diffused from the doped third silicon layer 27A into the doped second silicon layer 26A (see the reference numeral 37), and the impurity is diffused from the doped second silicon layer 26A into the doped first silicon layer 25A (see the reference numeral 38). The diffusion designated by the reference numerals 37 and 38 will be referred to as "secondary diffusion." By the secondary diffusion, the impurity is additionally doped into the doped first silicon layer 25A.

As a result, after the second annealing 36 is completed, the impurity may be uniformly distributed in the doped first silicon layer 25A, the doped second silicon layer 26A, and the doped third silicon layer 27A. In particular, the impurity may be sufficiently doped into the deep zone of the recess 23, that is, the lower surface of the doped first silicon layer 25A.

As is apparent from the above descriptions, by performing the impurity doping 28, the first annealing 29 and the second annealing 36 after containing the capture species 260 in the silicon-containing layer G, an impurity may be sufficiently doped up to the deep zone of the recess 23. For example, when doping an impurity, the impurity may be accumulated at a predetermined depth, and diffusion of the impurity may be induced by performing the first annealing 29 and the second annealing 35, by which a sufficiently large amount of the impurity may be doped to the deep zone of the recess 23.

Furthermore, even when performing impurity doping using the implantation method, by using the capture species 260, the impurity may be sufficiently doped into deep zone of the recess 23 while suppressing the penetration phenomenon.

Figure 5:
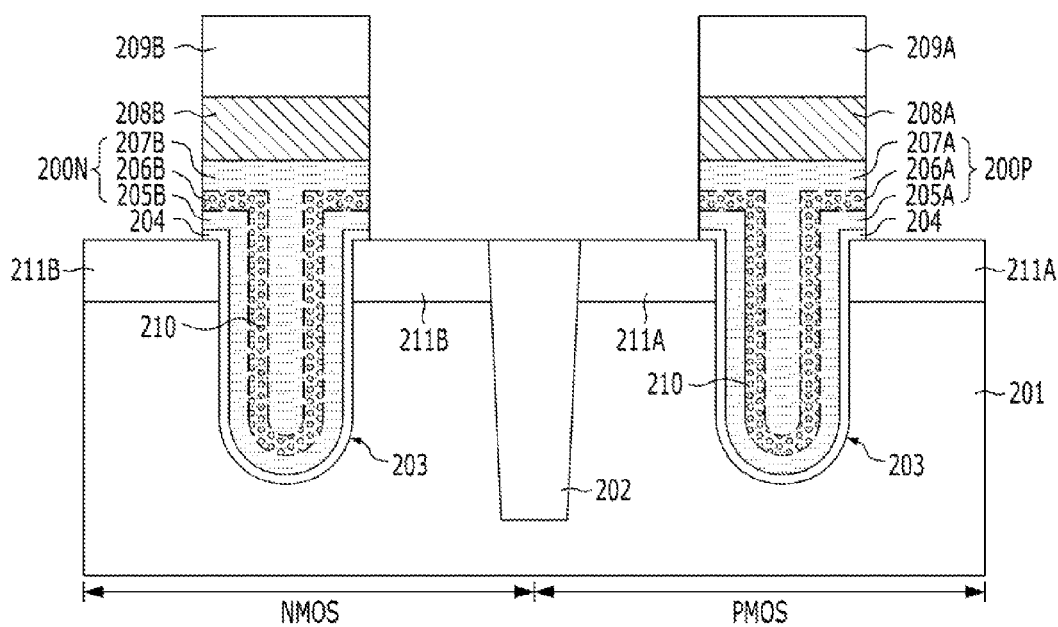
FIG. 5 is a view illustrating a transistor with a recess gate structure in accordance with a second embodiment of the present invention.

FIG. 5 is a view illustrating a transistor with a recess gate structure in accordance with a second embodiment of the present invention.

Referring to FIG. 5, a semiconductor substrate 201 has a plurality of transistor regions. The plurality of transistor regions may include a first region and a second region. An isolation region 202 is formed to isolate the first region and the second region from each other. The isolation region 202 has a trench structure and may be formed through an STI (shallow trench isolation) process. The isolation region 202 may include a dielectric layer (for example, a silicon oxide). The first region is a region where an NMOS is formed, and the second region is a region where a PMOS is formed. Hereinafter, the first region and the second region will be referred to as the "first NMOS region" and the "second PMOS region," respectively. The positions of the first NMOS region and the second PMOS region are for the sake of convenience in explanation, and may be interchanged with each other. The semiconductor substrate 201 may be formed of, but not limited to, silicon, germanium, or silicon and germanium. Furthermore, the entirety or a part of the semiconductor substrate 201 may be strained.

Recesses 203 of a predetermined depth are defined in the semiconductor substrate 201 in the first NMOS region and the second PMOS region. A gate dielectric layer 204 is formed on the surfaces of the recesses 203.

Recess gate structures, including silicon-containing electrodes 200N and 200P, which fill corresponding ones of the recesses 203, are formed on the gate dielectric layer 204 of the first NMOS region and the second PMOS region, P-type source/drain regions 211A and N-type source/drain regions 211B are formed in the semiconductor substrate 201 on both sides of the recess gate structures.

First, the recess gate structure formed in the first NMOS region may include an N-type doped silicon-containing electrode 200N, a metal electrode 208B and a gate hard mask layer 209B. The N-type doped silicon-containing electrode 200N may include an N-type doped first silicon layer 205B, an N-type doped second silicon layer 206B, and an N-type doped third silicon layer 207B. The N-type doped first silicon layer 205B and the N-type doped second silicon layer 206B are conformally formed on the gate dielectric layer 204, and the N-type doped third silicon layer 207B fills the recess 203 in the N-type doped second silicon layer 206B. The N-type doped first to third silicon layers 205B, 206B and 207B may include polysilicon layers. The N-type doped first to third silicon layers 205B, 206B and 207B may be polysilicon layers uniformly doped with an N-type impurity, such as phosphorus. The N-type doped second silicon layer 206B contains a capture species 210. The capture species 210 may include carbon or nitrogen, or a mixture of carbon and nitrogen. In the case of a mixture of carbon and nitrogen, the N-type doped second silicon layer 206B may be formed by stacking a nitrogen-containing zone and a carbon-containing zone.

Next, the recess gate structure formed in the second PMOS region may include a P-type doped silicon-containing electrode 200P, a metal electrode 208A, and a gate hard mask layer 209A. The P-type doped silicon-containing electrode 200P may include a P-type doped first silicon layer 205A, a P-type doped second silicon layer 206A, and a P-type doped third silicon layer 207A. The P-type doped first silicon layer 205A and the P-type doped second silicon layer 206A are conformally formed on the gate dielectric layer 204, and the P-type doped third silicon layer 207A fills the recess 204 in the P-type doped second silicon layer 206A. The P-type doped first to third silicon layers 205A, 206A and 207A may include polysilicon layers. The P-type doped first to third silicon layers 205A, 206A and 207A are polysilicon layers uniformly doped with a P-type impurity, such as boron. The P-type doped second silicon layer 206A contains a capture species 210. The capture species 210 may include carbon or nitrogen, or a mixture of carbon and nitrogen. In the case of a mixture of carbon and nitrogen, the P-type doped second silicon layer 206A may be formed by stacking a nitrogen-containing zone and a carbon-containing zone.

According to FIG. 5, both the NMOS and the PMOS include the recess gate structures. Moreover, the first NMOS region includes the N-type doped silicon-containing electrode 200N, and the second PMOS region includes the P-type doped silicon-containing electrode 200P. Both the N-type doped silicon-containing electrode 200N and the P-type doped silicon-containing electrode 200P contain the capture species 210. Due to the presence of the capture species 210, a sufficiently large amount of the impurities may be doped to the deep zones of the recesses 203.

In variations of the second embodiment, the capture species 210 may be contained in the P-type and N-type doped third silicon layers 207A and 207B or may be contained in the P-type and N-type doped first silicon layers 205A and 205B.

FIGS. 6A to 6H are views illustrating an exemplary method for forming the transistor in accordance with the second embodiment of the present invention. In the present embodiment, a method for fabricating a CMOS circuit will be described. It is to be noted that the present invention is not limited to the CMOS circuit. Instead, the present invention may be applied to all semiconductor device fabricating methods for forming an NMOS or a PMOS. The NMOS or the PMOS are formed in the CMOS circuit. The CMOS circuit includes at least one PMOS or NMOS. The CMOS circuit may constitute a sense amplifier.

Figure 6A:
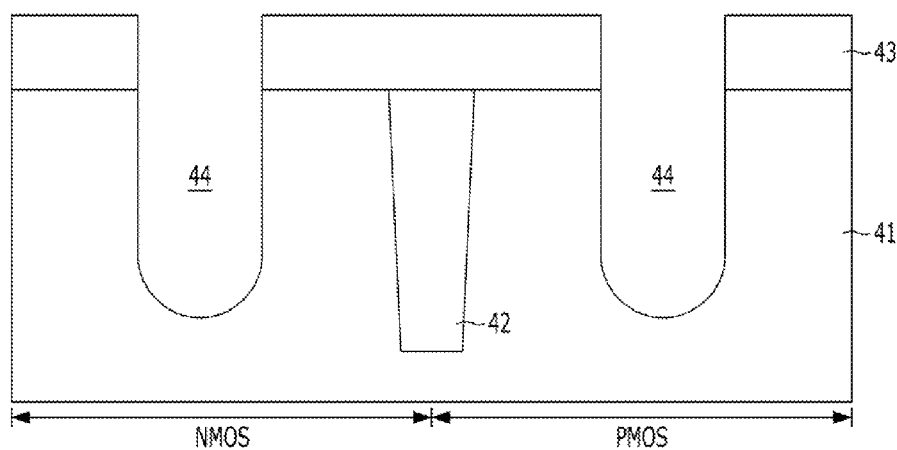
FIGS. 6A to 6H are views illustrating an exemplary method for forming the transistor in accordance with the second embodiment of the present invention.

Referring to FIG. 6A, a semiconductor substrate 41 has a plurality of transistor regions. The plurality of transistor regions may include a first region and a second region. An isolation region 42 is formed to isolate the first region and the second region from each other. The isolation region 42 has a trench structure and may be formed through an STI (shallow trench isolation) process. The isolation region 42 may include a dielectric layer (for example, a silicon oxide). The first region is a region where an NMOS is formed, and the second region is a region where a PMOS is formed. Hereinafter, the first region and the second region will be referred to as the "first NMOS region" and the "second PMOS region," respectively. The positions of the first NMOS region and the second PMOS region are for the sake of convenience in explanation, and may be interchanged with each other. The semiconductor substrate 41 may be formed of, but not limited to, silicon, germanium, or silicon and germanium. Furthermore, the entirety or a part of the semiconductor substrate 41 may be strained. Furthermore, while not shown, first wells and second wells may be formed in the first NMOS region and the second PMOS region through a well forming process generally known in the art. P-type first wells may be formed in the first NMOS region, and N-type second wells may be formed in the second PMOS region. In order to form the N-type second wells, an N-type impurity, such as phosphorus (P) or arsenic (As) may be implanted into the second PMOS region of the semiconductor substrate 41. In order to form the P-type first wells, a P-type impurity, such as boron (B) may be implanted into the first NMOS region of the semiconductor substrate 41. The semiconductor substrate 41 may include a silicon-containing substance. The semiconductor substrate 41 may include a silicon substrate or a silicon-germanium substrate.

A patterned hard mask layer 43 is formed on the semiconductor substrate 41. By etching portions of the semiconductor substrate 41 using the hard mask layer 43 as an etch barrier, recesses 44 are defined. The hard mask layer 43 may include a silicon oxide, a silicon nitride or the stack of a silicon oxide and a silicon nitride. Also, the hard mask layer 43 may include a substance with an etching selectivity when etching the semiconductor substrate 41. The recesses 44 are respectively defined in the first NMOS region and the second PMOS region. The recesses 44 may have a depth, for example, of approximately 2000 Å that varies according to a channel length. The recesses 44 may be defined by dry-etching the semiconductor substrate 41. Accordingly, the bottoms of the recesses 44 may have rounded profiles. While not shown, after defining the recesses 44, threshold voltage control ion implantation may be performed. In the threshold voltage control ion implantation, suitable impurities may be selected for the channels of transistors. Before the threshold voltage control ion implantation, a sacrificial layer (not shown) may be formed on the surfaces of the recesses 44. By forming the sacrificial layer, it is possible to minimize etch damage or defects that may be produced while defining the recesses 44. The sacrificial layer may be formed using a thermal oxidation process and may be removed after the threshold voltage control ion implantation.

Figure 6B:
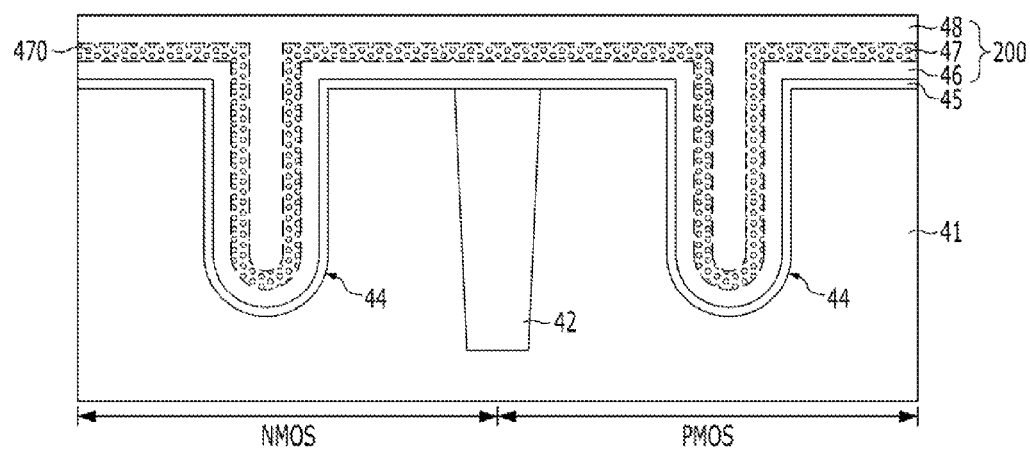

Referring to FIG. 6B, the hard mask layer 43 is removed. A gate dielectric layer 45 is formed on the entire surface of the semiconductor substrate 41 including the surface of the semiconductor substrate 41 that defines the recesses 44. The gate dielectric layer 45 may include a silicon oxide, a silicon nitride or a high dielectric constant (high-k) substance. The gate dielectric layer 45 may be formed through thermal oxidation, plasma oxidation, atomic layer deposition (ALD), chemical vapor deposition (CVD), etc. Subsequently, the gate dielectric layer 45 may be nitridated. The high-k substance generally has a dielectric constant higher than the dielectric constant (of approximately 3.9) of a silicon oxide ($SiO_2$). The high-k substance is substantially thicker physically than the silicon oxide and has a lower equivalent oxide thickness (EOT) value than the silicon oxide. For example, the high-k substance may include a metal-containing substance such as a metal oxide or a metal silicate. The metal oxide may include an oxide containing a metal, such as hafnium (Hf), aluminum (Al), lanthanum (La), or zirconium (Zr). The metal oxide may include, for example, a hafnium oxide ($HfO_2$), an aluminum oxide ($Al_2O_3$), a lanthanum oxide ($LaO_2$), a zirconium oxide ($ZrO_2$) or a combination thereof. The metal silicate may include a silicate containing a metal such as hafnium (Hf) or zirconium (Zr). The metal silicate may include a hafnium silicate (HfSiO), a zirconium silicate (ZrSiO), or a combination thereof.

A process for forming the high-k substance may include any suitable deposition technology. For example, chemical vapor deposition (CVD), low-pressure CVD (LPCVD), plasma-enhanced CVD (PECVD), metal-organic CVD (MOCVD), atomic layer deposition (ALD), plasma-enhanced ALD (PEALD), and so forth may be used. In order to form a uniform thin film, plasma-enhanced ALD (PEALD) may be used. The high-k substance may subsequently be exposed to a nitridation process, such as a plasma nitridation process. Accordingly, nitrogen is implanted into the high-k substance. For example, in the case where the high-k substance is a hafnium silicate (HfSiO), a hafnium silicon oxynitride (HfSiON) is formed by the nitridation process. In this way, by implanting nitrogen into a metal silicate, a dielectric constant increases, and it is possible to suppress crystallization of the metal silicate in a subsequent thermal process.

A gate conductive layer is formed on the entire surface of the gate dielectric layer 45 to fill the recesses 44. The gate conductive layer may include a silicon-containing layer 200 that is not doped with impurities. The undoped silicon-containing layer 200 may include at least a capture species 470.

The silicon-containing layer 200 may include multiple silicon layers. The multiple silicon layers may be stacked in order of a lower layer, an intermediate layer, and an upper layer. For example, the multiple silicon layers may include a first silicon layer 46, a second silicon layer 47, and a third silicon layer 48.

The first silicon layer 46 may include undoped silicon that is not doped with impurities. For example, the first silicon layer 46 may include undoped polysilicon. The first silicon layer 46 may be conformally deposited to a thickness that does not fill the recesses 44.

The second silicon layer 47 is formed on the first silicon layer 46. The second silicon layer 47 may be formed of undoped polysilicon in a manner similar to that of the first silicon layer 46. However, unlike the first silicon layer 46, the second silicon layer 47 may include a substance that contains a capture species 470. The second silicon layer 47 may be formed continuously after depositing the first silicon layer 46. Also, the second silicon layer 47 may be deposited contiguous with the first silicon layer 46. The capture species 470 contained in the second silicon layer 47 may include carbon or nitrogen. The capture species 470 serves to capture and store impurities and diffuse them to a surrounding structure in subsequent annealing. When forming the second silicon layer 47, a fine amount of the capture species 470 is doped into the second silicon layer 47 and the second silicon layer 47 is deposited. Accordingly, the second silicon layer 47 is an undoped polysilicon containing the capture species 470. If the concentration of the capture species 470 is too high, a diffusion of impurities may be suppressed. Therefore, the capture species 470 may have a concentration equal to or less than approximately $10^{10}$ atoms/cm$^3$. The capture species 470 may be doped in situ when depositing the second silicon layer 47. When depositing the second silicon layer 47, a carbon-containing gas or a nitrogen-containing gas may be flowed in addition to a silicon source gas. The carbon-containing gas and the nitrogen-containing gas may be simultaneously flowed, and accordingly, the second silicon layer 47 may contain both of carbon and nitrogen as the capture species 470. In another example, after forming a nitrogen-containing zone by first flowing the nitrogen-containing gas, a carbon-containing zone may be formed by flowing the carbon-containing gas.

The third silicon layer 48 is formed on the second silicon layer 47 to fill the recesses 44. The third silicon layer 48 may be formed of the same substance as the first and second silicon layers 46 and 47. The third silicon layer 48 may include undoped silicon that is not doped with an impurity. For example, the third silicon layer 48 may include undoped polysilicon.

The third silicon layer 48 is planarized. The planarization may be carried out through etch-back or chemical mechanical polishing (CMP).

In this way, the silicon-containing layer 200 is formed as a substance that fills the recesses 44. The silicon-containing layer 200 may include a multi-layered structure of undoped polysilicon, the multi-layered structure including the second silicon layer 47 that contains the capture species 470. The first to third silicon layers 46, 47 and 48 may be deposited through chemical vapor deposition (CVD), atomic layer deposition (ALD), etc.

The recesses 44 are filled by sequentially depositing the first silicon layer 46, the second silicon layer 47, and the third silicon layer 48. Due to the fact that the second silicon layer 47, containing the capture species 470, is formed between the first silicon layer 46 and the third silicon layer 48, a sandwich structure is completed. The first silicon layer 46, the second silicon layer 47, and the third silicon layer 48 may have the same thickness. Alternatively, the first silicon layer 46 and the third silicon layer 48 may have the same thickness, while the second silicon layer 47 may thinner than the first and third silicon layers 46 and 48. The second silicon layer 47 is positioned at least in the recesses 44. The second silicon layer 47 may be formed parallel to the surface of the substrate 41 that defines the recesses 44. In other words, the second silicon layer 47 may be formed at a uniform distance from the surfaces of the recesses 44. The first silicon layer 46 is positioned between the surfaces of the recesses 44 and the second silicon layer 47.

Figure 6C:
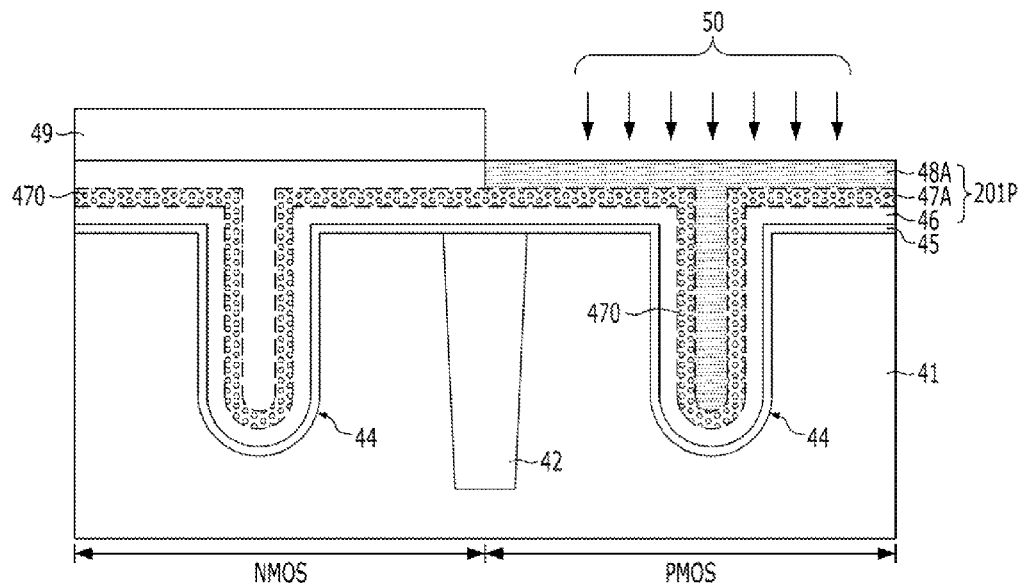

Referring to FIG. 6C, a first mask pattern 49 is formed on the third silicon layer 48 to cover the first NMOS region. The first mask pattern 49 does not cover the second PMOS region.

A first impurity doping 50 is performed to dope the second PMOS region with a P-type impurity, such as boron. The first impurity doping 50 may use a plasma doping method or an implantation method. For example, $^{11}$B may be used as an impurity source.

By performing the first impurity doping 50 in this way, impurities are doped into the third silicon layer 48 of the second PMOS region.

When the impurities are doped using the plasma doping method, as energy is increased, a substantial concentration change on a surface does not occur, and only a slope of a concentration distribution based on a doping depth changes so that the doping depth gradually increases. Thus, in the case of increasing energy, the impurity doping concentration of the third silicon layer 48 may be increased in a deep zone of the recess 44 of the second PMOS region. Furthermore, the impurities may be diffused to the second silicon layer 47 underlying the third silicon layer 48. Impurities diffused in this way are captured by the capture species 470 that is contained in the second silicon layer 47, and are accumulated in the second silicon layer 47.

In the case of using the implantation method, the first impurity doping 50 may be performed by setting an Rp (projection range) to a deep zone of the recess 44 of the second PMOS region. Therefore, impurities are doped into not only the third silicon layer 48, but also into the second silicon layer 47. In particular, when using the implantation method, as penetration is suppressed by the capture species 470 contained in the second silicon layer 47, the impurities are accumulated in the second silicon layer 47. Since a penetration phenomenon is suppressed by the capture species 470, ion implantation energy may be sufficiently increased. Also, a subsequent thermal process may be performed at a high temperature.

In this way, by forming the second silicon layer 47, containing the capture species 470 in the silicon-containing layer 200, impurities may be accumulated in the second silicon layer 47 when using the plasma doping method or the implantation method. Accordingly, by the first impurity doping 50, the third silicon layer 48, of the second PMOS region, becomes a P-type doped third silicon layer 48A and the second silicon layer 47, of the second PMOS region, becomes a P-type doped second silicon layer 47A. The P-type doped second silicon layer 47A contains the capture species 470. Therefore, a partially P-type doped silicon-containing layer 201P is formed in the second PMOS region.

Figure 6D:
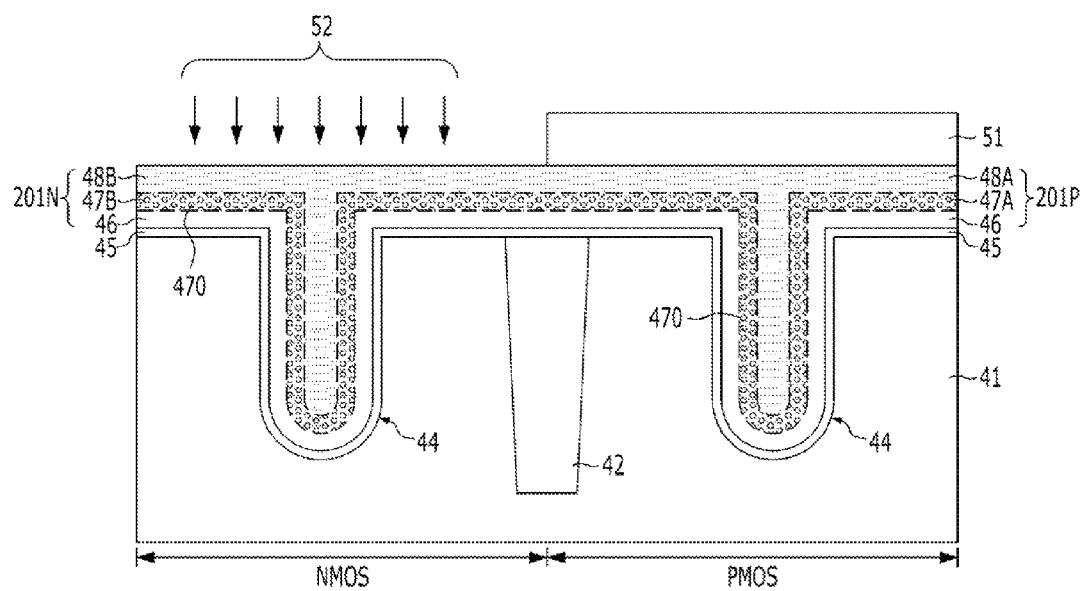

Referring to FIG. 6D, the first mask pattern 49 is removed.

A second mask pattern 51, which covers the second PMOS region, but not the first NMOS region, is formed on the partially P-type doped silicon-containing layer 201P.

A second impurity doping 52 is performed to dope the first NMOS region with a N-type impurity, such as phosphorus (P). The second impurity doping 52 may use a plasma doping method or an implantation method. For example, $^{31}$P may be used as an impurity source.

By performing the second impurity doping 52 in this way, an impurity is doped into the third silicon layer 48 of the first NMOS region.

When doping the impurities using the plasma doping method, as energy is increased, a substantial concentration change on a surface does not occur, and only a slope of a concentration distribution based on a doping depth changes so that the doping depth gradually increases. Thus, in the case of increasing energy, the impurity doping concentration of the third silicon layer 48 may be increased in a deep zone of the recess 44. Furthermore, the impurities may be diffused to the second silicon layer 47 underlying the third silicon layer 48. Impurities diffused in this way are captured by the capture species 470 that is contained in the second silicon layer 47, and are accumulated in the second silicon layer 47.

In the case of adopting the implantation method, the first impurity doping 50 may be performed by setting an Rp to a deep zone of the recess 44 of the first NMOS region. Therefore, impurities are doped into not only the third silicon layer 48, but also into the second silicon layer 47. In particular, when using the implantation method, as penetration is suppressed by the capture species 470 contained in the second silicon layer 47, the impurities are accumulated in the second silicon layer 47. Since a penetration phenomenon is suppressed by the capture species 470, ion implantation energy may be sufficiently increased. Also, a subsequent thermal process may be performed at a high temperature.

In this way, by forming the second silicon layer 47 containing the capture species 470, impurities may be accumulated in the second silicon layer 47 when adopting the plasma doping method or the implantation method. Accordingly, by the second impurity doping 52, the third silicon layer 48, of the first NMOS region, becomes a N-type doped third silicon layer 48B and the second silicon layer 47, of the first NMOS region, becomes a N-type doped second silicon layer 476. The N-type doped second silicon layer 476 contains the capture species 470. Therefore, a partially N-type doped silicon-containing layer 201N is formed in the first NMOS region.

Figure 6E:
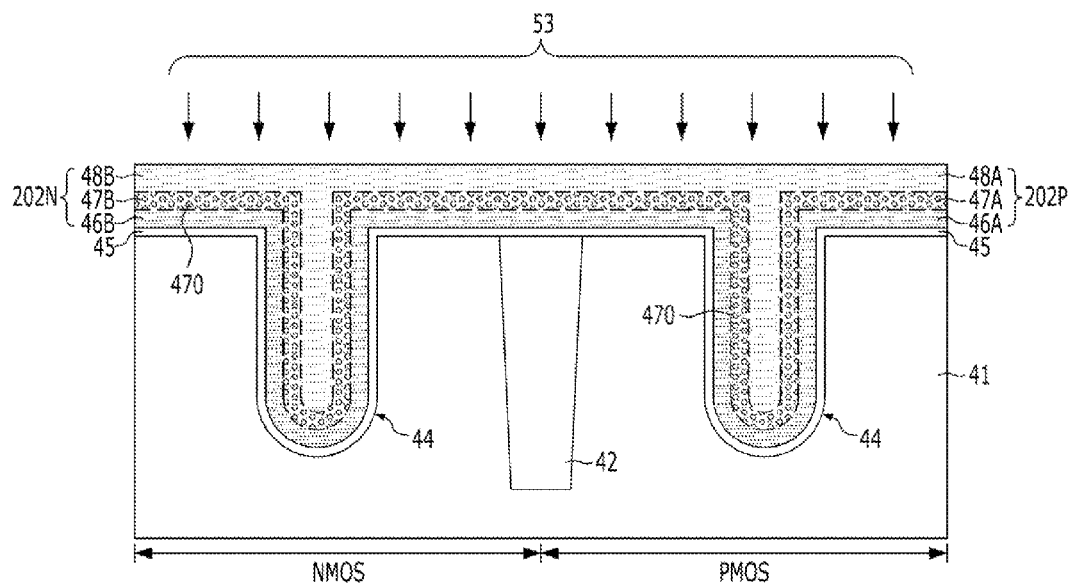

Referring to FIG. 6E, a first annealing 53 is performed. Accordingly, an impurity is diffused from the P-type doped third silicon layer 48A to the P-type doped second silicon layer 47A and an impurity id diffused from the N-type doped third silicon layer 486 to the N-type doped second silicon layer 47B. Moreover, the impurity accumulated in the P-type doped second silicon layer 47A and the impurity accumulated in the N-type doped second silicon layer 47B are diffused to the first silicon layer 46. The diffusion by the first annealing 53 will be referred to as "primary diffusion."

By sequentially performing the first and second impurity doping 50 and 52 and the first annealing 53 as described above, all of the first to third silicon layers are in doped states. Namely, doped silicon-containing layers 202N and 202P are formed in the recesses 44.

The doped silicon-containing layers include a P-type doped silicon-containing layer 202P and an N-type doped silicon-containing layer 202N. The P-type doped silicon-containing layer 202P includes a P-type doped first silicon layer 46A, a P-type doped second silicon layer 47A, and a P-type doped third silicon layer 48A. The N-type doped silicon-containing layer 202N includes an N-type doped first silicon layer 463, an N-type doped second silicon layer 47B, and an N-type doped third silicon layer 48B. The P-type doped second silicon layer 47A and the N-type doped second silicon layer 47B both are doped with an impurity and the capture species 470. The P-type doped first silicon layer 46A and the N-type doped first silicon layer 463 and the P-type doped third silicon layer 48A and the N-type doped third silicon layer 48B are doped with an impurity, but are not doped with the capture species. In the case where the doped silicon-containing layer is polysilicon, it becomes a P-type doped polysilicon layer or an N-type doped polysilicon layer depending on the type of impurity that is used for doping.

Figure 6F:
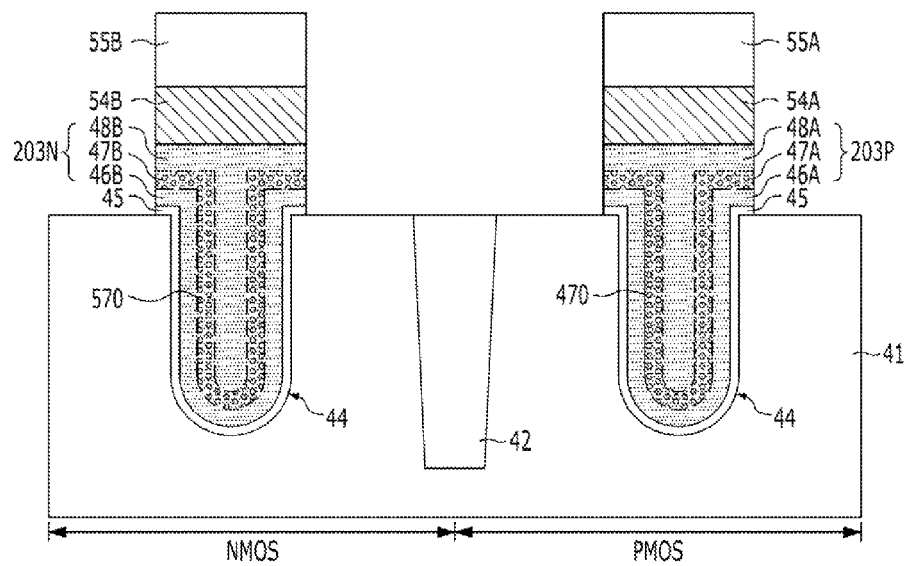

Referring to FIG. 6F, after forming a metal layer and a gate hard mask layer on the P-type and N-type doped on-containing layer 202P and 202N, a gate etching process is performed to form recess gate structures in the first NMOS region and in the second PMOS region. A recess gate structure, in which an N-type doped silicon-containing electrode 203N, a metal electrode 543, and a gate hard mask layer 55B are stacked, is formed in the first NMOS region. A recess gate structure, in which a P-type doped silicon-containing electrode 203P, a metal electrode 54A, and a gate hard mask layer 55A are stacked, is formed in the second PMOS region. The metal electrodes 54A and 54B may include a low resistance substance. For example, the metal electrodes 54A and 546 may include a tungsten or a titanium nitride layer. The gate hard mask layers 55A and 55B may include a silicon nitride. In the recess gate structures, the P-type and N-type doped silicon-containing electrodes 203P and 203N have shapes that fill the recesses 44. While not shown, a gate spacer process may be performed after the gate etching process. As gate spacers, a silicon oxide, a silicon nitride, and so forth may be used.

Figure 6G:
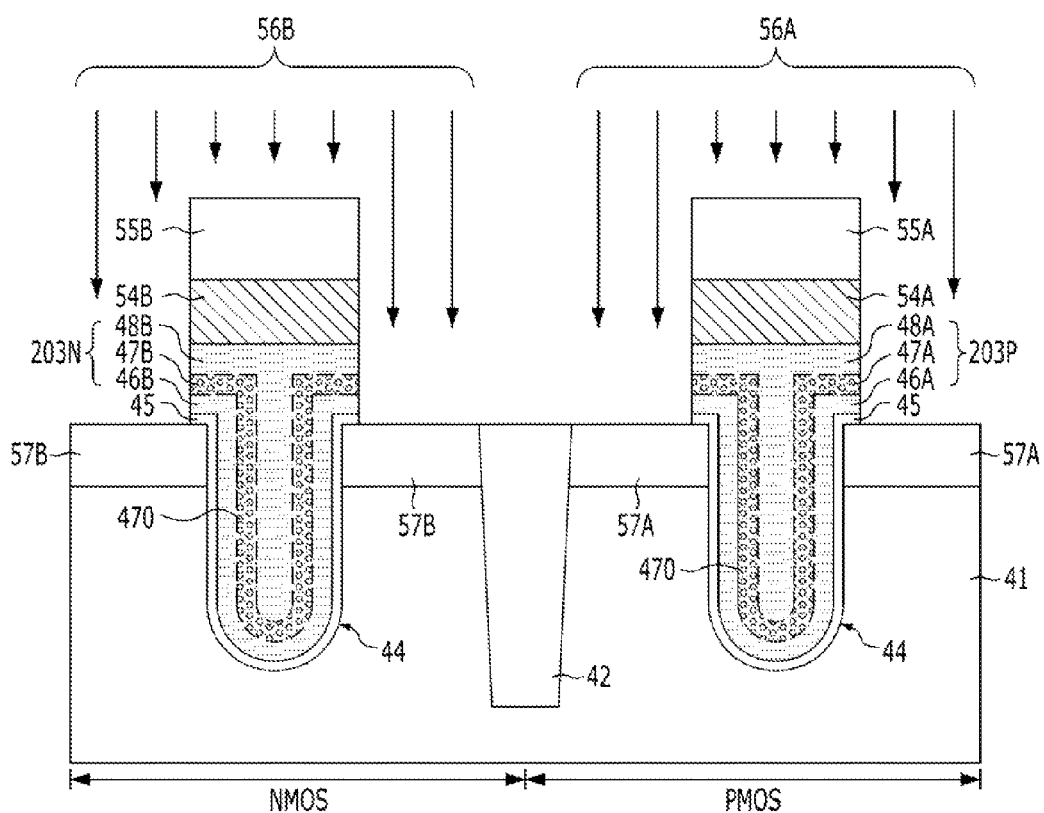

Referring to FIG. 6G, a third doping may be performed. P-type source/drain regions 57A may be formed by doping a P-type impurity, using, for example, ion implantation 56A. N-type source/drain regions 57B may be formed by doping a N-type impurity, using, for example, ion implantation 56B.

Figure 6H:
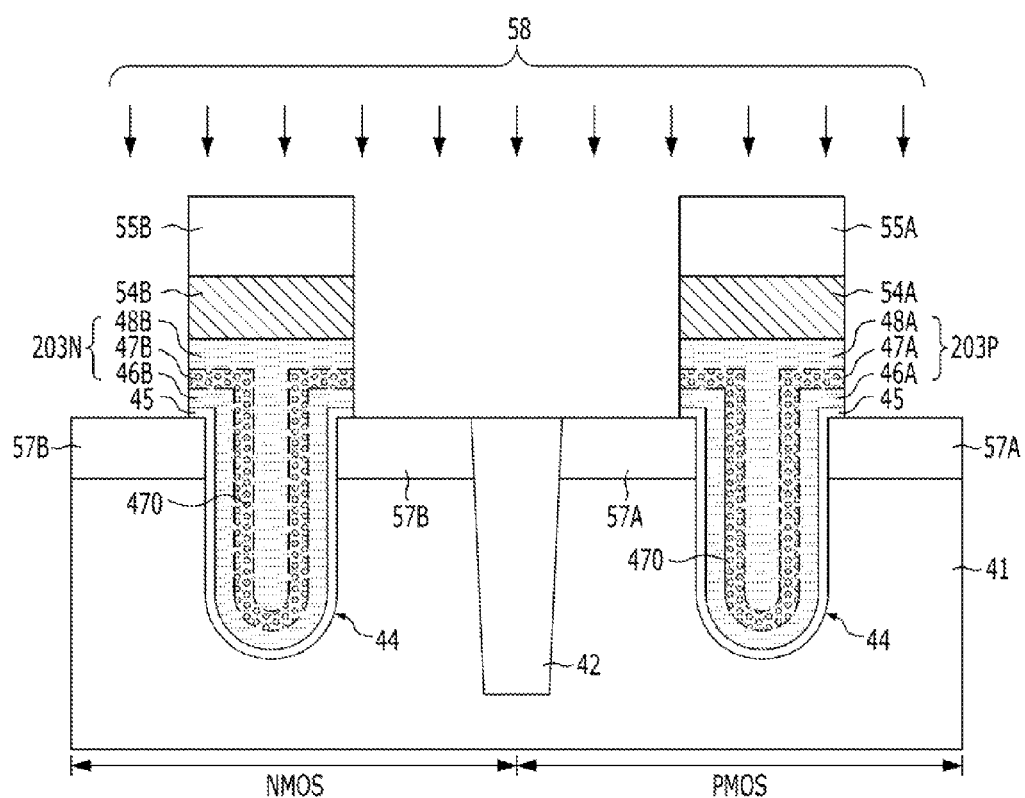

Referring to FIG. 6H, second annealing 58 is performed. The second annealing 58 may include rapid thermal annealing. The second annealing 58 is performed to activate the impurities implanted into the P-type source/drain regions 57A and the N-type source/drain regions 57B.

When performing the second annealing 58 as described above, impurities are diffused from the P-type and N-type doped third silicon layers 48A and 48B to the P-type and N-type doped second silicon layers 47A and 47B, respectively, and impurities are diffused from the P-type and N-type doped second silicon layers 47A and 47B to the P-type and N-type doped first silicon layers 46A and 46B, respectively. The diffusion by the second annealing 58 will be referred to as "secondary diffusion." By the secondary diffusion, impurities are additionally doped into the P-type and N-type doped first silicon layers 46A and 46B.

As a result, after the second annealing 58 is completed, impurities may be uniformly distributed in the P-type doped third silicon layer 48A and in the N-type doped third silicon layer 48B, the P-type doped second silicon layer and the N-type doped second silicon layer 47B, and the P-type doped first silicon layer 46A and the N-type doped first silicon layer 46B. In particular, impurities may be sufficiently doped into the deep zones of the recesses 44, that is, the lower surface of the P-type doped first silicon layer 46A and of the N-type doped first silicon layer 46B.

As is apparent from the above description, N-type and P-type impurities may be sufficiently doped into the deep zones of the recesses 44 by performing the first and second impurity doping 50 and 52, the first annealing 53, and the second annealing 58, after containing the capture species 470 in the silicon-containing layer 200. That is, when performing the first and second impurity doping 50 and 52, N-type and P-type impurities may be accumulated at a predetermined depth, and diffusion of the N-type and P-type impurities may be induced by performing the first annealing 53 and the second annealing 58, by which sufficiently large amounts of N-type and P-type impurities may be doped into the deep zones of the recesses 44.

Furthermore, by performing impurity doping using the implantation method after containing the capture species 470, impurities may be sufficiently doped up to the deep zones of the recesses 44 while suppressing the penetration phenomenon.

Figure 7:
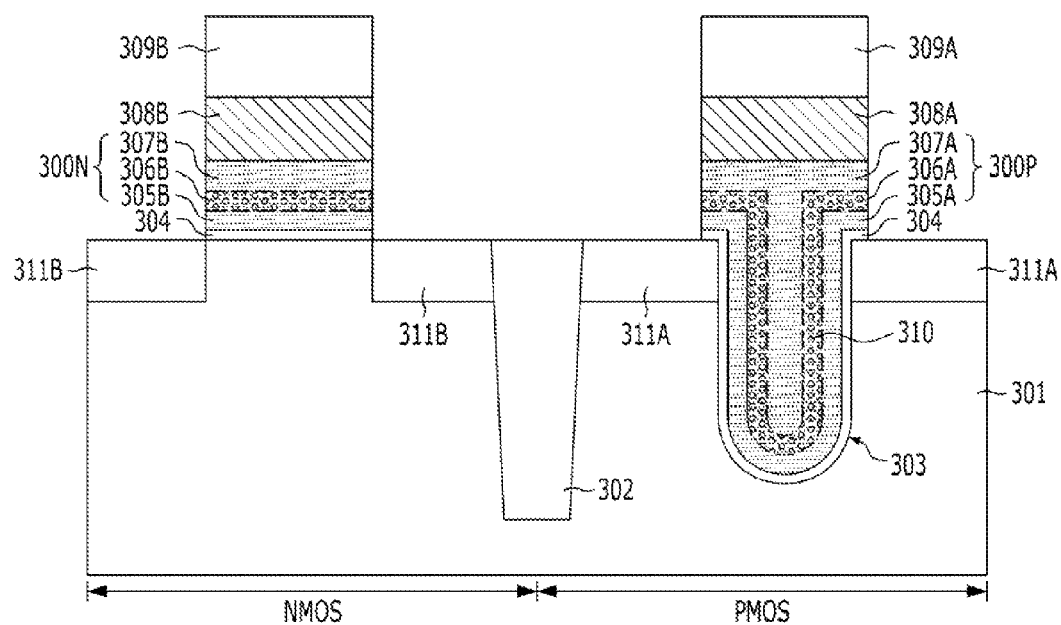
FIG. 7 is a view illustrating a transistor with a recess gate structure in accordance with a third embodiment of the present invention.

FIG. 7 is a view illustrating a transistor with a recess gate structure in accordance with a third embodiment of the present invention.

Referring to FIG. 7, a semiconductor substrate 301 has a plurality of transistor regions. The plurality of transistor regions may include a first region and a second region. An isolation region 302 is formed to isolate the first region and the second region from each other. The isolation region 302 has a trench structure and may be formed through an STI (shallow trench isolation) process. The isolation region 302 may include a dielectric layer (for example, a silicon oxide). The first region is a region where an NMOS is formed, and the second region is a region where a PMOS is formed. Hereinafter, the first region and the second region will be referred to as the "first NMOS region" and the "second PMOS region," respectively. The positions of the first NMOS region and the second PMOS region are for the sake of convenience in explanation, and may be changed with each other. The semiconductor substrate 301 may be formed of, but not limited to, silicon, germanium or silicon and germanium. Furthermore, the entirety or a part of the semiconductor substrate 301 may be strained.

A recess 303 of a predetermined depth is defined in the semiconductor substrate 301 in the second PMOS region. The recess 303 is not defined in the first NMOS region.

A gate dielectric layer 304 is formed on the surface of the recess 303. The gate dielectric layer 304 is also formed on the semiconductor substrate 301 in the first NMOS region.

A P-type silicon-containing electrode 300P, formed in the recess gate structure and extending into the recess 303, is formed on the gate dielectric layer 304 of the second PMOS region. P-type source/drain regions 311A are formed in the semiconductor substrate 301 on both sides of the recess gate structure. In detail, the recess gate structure formed in the second PMOS region includes a P-type doped silicon-containing electrode 300P, a metal electrode 308A, and a gate hard mask layer 309A. The P-type doped silicon-containing electrode 300P includes a P-type doped first silicon layer 305A, a P-type doped second silicon layer 306A, and a P-type doped third silicon layer 307A. The P-type doped first silicon layer 305A and the P-type doped second silicon layer 306A are conformally formed on the gate dielectric layer 304, and the P-type doped third silicon layer 307A fills the recess 303 defined by the P-type doped second silicon layer 306A. The P-type doped first to third silicon layers 305A, 306A, and 307A may include polysilicon layers. The P-type doped first to third silicon layers 305A, 306A, and 307A may be uniformly doped with a P-type impurity, such as boron. The P-type doped second silicon layer 306A contains a capture species 310. The capture species 310 may include carbon or nitrogen, or a mixture of carbon and nitrogen. In the case of a mixture of carbon and nitrogen, the P-type doped second silicon layer 306A may be formed by stacking a nitrogen-containing zone and a carbon-containing zone.

The planar gate structure formed in the first NMOS region may include an N-type doped silicon-containing electrode 300N, a metal electrode 308B, and a gate hard mask layer 309B. The N-type doped silicon-containing electrode 300N may include an N-type doped first silicon layer 305B, an N-type doped second silicon layer 306B, and an N-type doped third silicon layer 307B. The N-type doped first to third silicon layers 305B, 306B, and 307B may include polysilicon layers. The N-type doped first to third silicon layers 305B, 306B and 307B are doped with an N-type impurity. The N-type doped first to third silicon layers 305B, 306B and 307B may be uniformly doped with an impurity, such as phosphorus. The N-type doped second silicon layer 306B contains a capture species 310. The capture species 310 may include carbon or nitrogen, or a mixture of carbon and nitrogen. In the case of a mixture of carbon and nitrogen, the N-type doped second silicon layer 306B may be formed by stacking a nitrogen-containing zone and a carbon-containing zone. N-type source/drain regions 311B are formed in the semiconductor substrate 301 on both sides of the planar gate structure.

According to FIG. 7, the NMOS may include the planar gate structure, and the PMOS may include the recess gate structure. Moreover, the NMOS includes the N-type doped silicon-containing electrode 300N, and the PMOS includes the P-type doped silicon-containing electrode 300P. Both the N-type doped silicon-containing electrode 300N and the P-type doped silicon-containing electrode 300P contain the capture species 310. Due to the presence of the capture species 310, a sufficiently large amount of a P-type impurity may be doped into the deep zone of the recess 303.

In variations of the third embodiment, the capture species 310 may be contained in the P-type doped third silicon layer 307A and the N-type doped third silicon layer 307B or the capture species 310 may be contained in the P-type doped first silicon layer 305A and the N-type doped first silicon layer 305B.

FIGS. 8A to 8H are views illustrating an exemplary method for forming the transistor in accordance with the third embodiment of the present invention. In the present embodiment, a method for fabricating a CMOS circuit will be described. It is to be noted that the present invention is not limited to the CMOS circuit. Instead, the present invention may be applied to all semiconductor device fabricating methods for forming an NMOS or a PMOS. The NMOS or the PMOS may be formed in the CMOS circuit. The CMOS circuit may include at least one PMOS or NMOS. The CMOS circuit may constitute a sense amplifier.

Figure 8A:
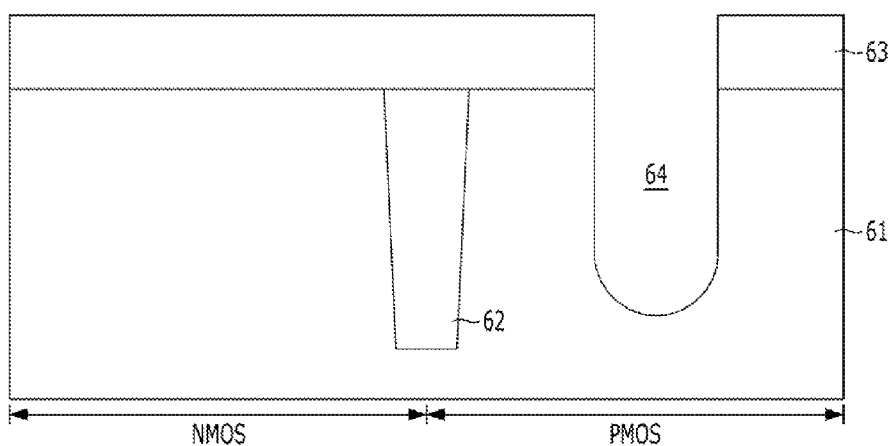
Figure 8B:
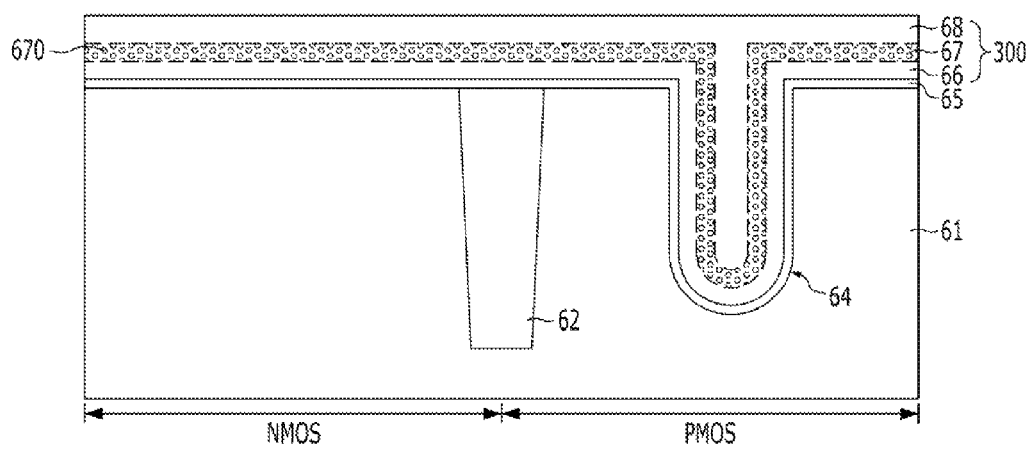

Referring to FIG. 8A, a semiconductor substrate 61 has a plurality of transistor regions. The plurality of transistor regions may include a first region and a second region. An isolation region 62 is formed to isolate the first region and the second region from each other. The isolation region 62 has a trench structure and may be formed through an STI (shallow trench isolation) process. The isolation region 62 may include a dielectric layer (for example, a silicon oxide). The first region is a region where an NMOS is formed, and the second region is a region where a PMOS is formed. Hereinafter, the first region and the second region will be referred to as the "first NMOS region" and the "second PMOS region," respectively. The positions of the first NMOS region and the second PMOS region are for the sake of convenience in explanation, and may be interchanged with each other. The semiconductor substrate 61 may be formed of, but not limited to, silicon, germanium, or silicon and germanium. Furthermore, the entirety or a part of the semiconductor substrate 61 may be strained. Furthermore, while not shown, first wells and second wells may be formed in the first NMOS region and the second PMOS region through a well forming process generally known in the art. P-type first wells may be formed in the first NMOS region, and N-type second wells may be formed in the second PMOS region. In order to form the N-type second wells, a N-type impurity such as phosphorus (P) or arsenic (As) may be implanted into the second PMOS region of the semiconductor substrate 61. In order to form the P-type first wells, a P-type impurity such as boron (B) may be implanted into the first NMOS region of the semiconductor substrate 61. The semiconductor substrate 61 may include a silicon-containing substance. The semiconductor substrate 61 may include a silicon substrate or a silicon-germanium substrate.

A patterned hard mask layer 63 is formed on the semiconductor substrate 61. By etching a portion of the semiconductor substrate 61 in the second PMOS region using the hard mask layer 63 as an etch barrier, a recess 64 is defined. The hard mask layer 63 may include a silicon oxide, a silicon nitride or the stack of a silicon oxide and a silicon nitride. Also, the hard mask layer 63 may include a substance with an etching selectivity when etching the semiconductor substrate 61. The recess 64 is defined in the second PMOS region. The recess 64 may have a depth, for example, of approximately 2000 Å that varies according to a channel length. The recess 64 may be defined by dry-etching the semiconductor substrate 61. Accordingly, the bottom of the recess 64 may have a rounded profile. While not shown, after defining the recess 64, an ion implantation of an impurity for controlling a threshold voltage (referred to as "threshold voltage control ion implantation") may be performed. In the threshold voltage control ion implantation, a suitable impurity may be selected for the channel of a transistor. Before the threshold voltage control ion implantation, a sacrificial layer (not shown) may be formed on the surface of the recess 64. By forming the sacrificial layer, it is possible to minimize etch damage or defects that may be produced while defining the recess 64. The sacrificial layer may be formed using a thermal oxidation process and may be removed after the threshold voltage control ion implantation.

Referring to FIG. 5B, the hard mask layer 63 is removed. A gate dielectric layer 65 is formed on the entire surface of the semiconductor substrate 61, including the surface of the semiconductor substrate 41 that defines the recess 64. The gate dielectric layer 65 may include a silicon oxide, a silicon nitride, or a high-k substance. The gate dielectric layer 65 may be formed through thermal oxidation, plasma oxidation, atomic layer deposition (ALD) chemical vapor deposition (CVD), etc. Subsequently, the gate dielectric layer 65 may be nitridated. The high-k substance includes a substance with a high dielectric constant. The high-k substance generally has a dielectric constant higher than the dielectric constant (of approximately 3.9) of a silicon oxide ($SiO_2$). The high-k substance is substantially thicker physically than the silicon oxide and has a lower equivalent oxide thickness (EOT) value than the silicon oxide. For example, the high-k substance may include a metal-containing substance, such as a metal oxide or a metal silicate. The metal oxide may, for example, include an oxide containing a metal, such as hafnium (Hf), aluminum (Al), lanthanum (La) or zirconium (Zr). The metal oxide may include a hafnium oxide ($HfO_2$), an aluminum oxide ($Al_2O_3$), a lanthanum oxide ($LaO_2$), a zirconium oxide ($ZrO_2$), or a combination thereof. The metal silicate may include a silicate containing a metal, such as hafnium (Hf) or zirconium (Zr). The metal silicate may, for example, include a hafnium silicate (HfSiO) a zirconium silicate (ZrSiO), or a combination thereof.

A process for forming the high-k substance may include any suitable deposition technology. For example, chemical vapor deposition (CVD), low-pressure CVD (LPCVD), plasma-enhanced CVD (PECVD), metal-organic CVD (MOCVD), atomic layer deposition (ALD), plasma-enhanced ALD (PEALD), and so forth may be used. In order to form a uniform thin film, plasma-enhanced ALD (PEALD) may be used. The high-k substance may subsequently be exposed to a nitridation process, such as a plasma nitridation process. Accordingly, nitrogen is implanted into the high-k substance. For example, in the case where the high-k substance is a hafnium silicate (HfSiO), a hafnium silicon oxynitride (HfSiON) is formed by the nitridation process. In this way, by implanting nitrogen into a metal silicate, a dielectric constant increases, and it is possible to suppress crystallization of the metal silicate in a subsequent thermal process.

A gate conductive layer is formed on the entire surface of the semiconductor substrate 61, including the gate dielectric layer 65, to fill the recess 64. The gate conductive layer may include a silicon-containing layer 300 that is not doped with an impurity. The undoped silicon-containing layer 300 may include at least a capture species 670.

The silicon-containing layer 300 may include multiple silicon layers. The multiple silicon layers may be stacked in order of a lower layer, an intermediate layer, and an upper layer. For example, the multiple silicon layers may include a first silicon layer 66, a second silicon layer 67 and a third silicon layer 68.

The first silicon layer 66 may include undoped silicon that is not doped with an impurity. For example, the first silicon layer 66 may include undoped polysilicon. The first silicon layer 66 may be conformally deposited to a thickness that does not fill the recess 64.

The second silicon layer 67 is formed on the first silicon layer 66. The second silicon layer 67 may be formed of undoped polysilicon in a same manner similar to that of the first silicon layer 66. However, unlike the first silicon layer 66, the second silicon layer 67 may include a substance that contains a capture species 670. The second silicon layer 67 may be formed continuously after depositing the first silicon layer 66. Also, the second silicon layer 67 may be deposited contiguous with the first silicon layer 66. The capture species 670 contained in the second silicon layer 67 may include carbon or nitrogen. The capture species 670 serves to capture and store impurities and diffuse them into a surrounding structure during subsequent annealing. When forming the second silicon layer 67, the capture species 670 is doped and deposited. Accordingly, the second silicon layer 67 is undoped polysilicon containing the capture species 670. If the concentration of the capture species 670 is too high, a diffusion of an impurity may be suppressed. Therefore, the capture species 670 may have a concentration equal to or less than approximately $10^{10}$ atoms/cm$^3$. The capture species 670 may be doped in situ when depositing the second silicon layer 67. When depositing the second silicon layer 67, a carbon-containing gas or a nitrogen-containing gas may be flowed in addition to a silicon source gas. The carbon-containing gas and the nitrogen-containing gas may be simultaneously flowed, and accordingly, the second silicon layer 67 may contain both of carbon and nitrogen as the capture species 670.

The third silicon layer 68 is formed on the second silicon layer 67 to fill the recess 64. The third silicon layer 68 may be formed of the same substance as the first and second silicon layers 66 and 67. The third silicon layer 68 may include undoped silicon that is not doped with impurities. For example, the third silicon layer 68 may include undoped polysilicon. In another example, after forming a nitrogen-containing zone by first flowing the nitrogen-containing gas, a carbon-containing zone may be formed by flowing the carbon-containing gas.

The third silicon layer 68 is planarized. The planarization may be carried out through etch-back or chemical mechanical polishing (CMP).

In this way, the silicon-containing layer 300 is formed as a substance that fills the recess 64. The silicon-containing layer 300 may include a multi-layered structure of undoped polysilicon, the multi-layered structure including the second silicon layer 67 that contains the capture species 670. The first to third silicon layers 66, 67 and 68 may be deposited through chemical vapor deposition (CVD), atomic layer deposition (ALD), etc.

The recess 64 is filled by sequentially depositing the first silicon layer 66, the second silicon layer 67, and the third silicon layer 68. Due to the fact that the second silicon layer 67, containing the capture species 670, is formed between the first silicon layer 66 and the third silicon layer 68, a sandwich structure is completed. The first silicon layer 66, the second silicon layer 67, and the third silicon layer 68 may have the same thickness. Alternatively, the first silicon layer 66 and the third silicon layer 68 may have the same thickness, while the second silicon layer 67 may thinner than the first and third silicon layers 66 and 68. The second silicon layer 67 is positioned at least in the recess 64. The second silicon layer 67 may be formed parallel to the surface of the substrate 51 that defines the recess 64. In other words, the second silicon layer 67 may be formed at a uniform distance from the surface of the recess 64. The first silicon layer 66 is positioned between the surface of the recess 64 and the second silicon layer 67.

Figure 8C:
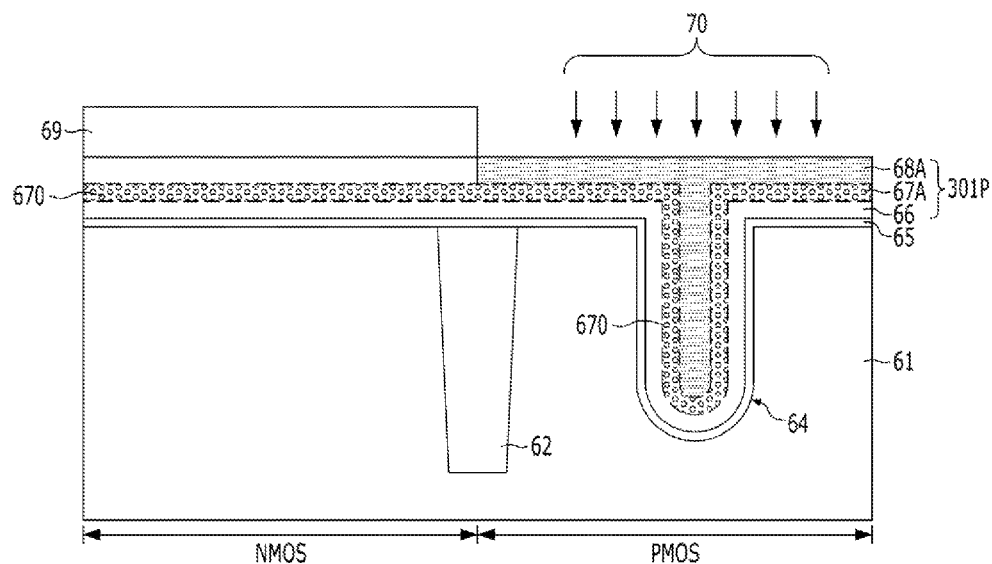

Referring to FIG. 8C, a first mask pattern 69 is formed on the third silicon layer 68 to cover the first NMOS region. The first mask pattern 69 does not cover the second PMOS region.

A first impurity doping 70 is performed to dope the second PMOS region with a P-type impurity, such as boron. The first impurity doping 70 may use a plasma doping method or an implantation method. For example, $^{11}$B may be used as an impurity source.

By performing the first impurity doping 70 in this way, the impurity is doped into the third silicon layer 68 of the second PMOS region.

When the impurity is doped using the plasma doping method, as energy is increased, a substantial concentration change on a surface does not occur, and only a slope of a concentration distribution based on a doping depth changes so that the doping depth gradually increases. Thus, in the case of increasing energy, the impurity doping concentration of the third silicon layer 68 may be increased in a deep zone of the recess 64 of the second PMOS region. Furthermore, the impurities may be diffused to the second silicon layer 67 underlying the third silicon layer 68. An impurity diffused in this way is captured by the capture species 670 that is contained in the second silicon layer 67, and is accumulated in the second silicon layer 67.

In the case of using the implantation method, the first impurity doping 70 may be performed by setting an Rp (projection range) to a deep zone of the recess 64. Therefore, impurities are doped into not only the third silicon layer 68, but also to the second silicon layer 67. In particular, when using the implantation method, as penetration is suppressed by the capture species 670 contained in the second silicon layer 67, the impurities are accumulated in the second silicon layer 67. Since a penetration phenomenon is suppressed by the capture species 670, ion implantation energy may be sufficiently increased. Also, a subsequent thermal process may be performed at a high temperature.

In this way, by forming the second silicon layer 67 containing the capture species 670 in the silicon-containing layer 300, impurities may be accumulated in the second silicon layer 67, when using the plasma doping method or the implantation method. Accordingly, by the first impurity doping 70, the third silicon layer 68, of the second PMOS region, becomes a P-type doped third silicon layer 68A and the second silicon layer 67, of the second PMOS region, becomes a P-type doped second silicon layer 67A. The P-type doped second silicon layer 67A contains the capture species 670. Therefore, a partially P-type doped silicon-containing layer 301P is formed in the second PMOS region.

Figure 8D:
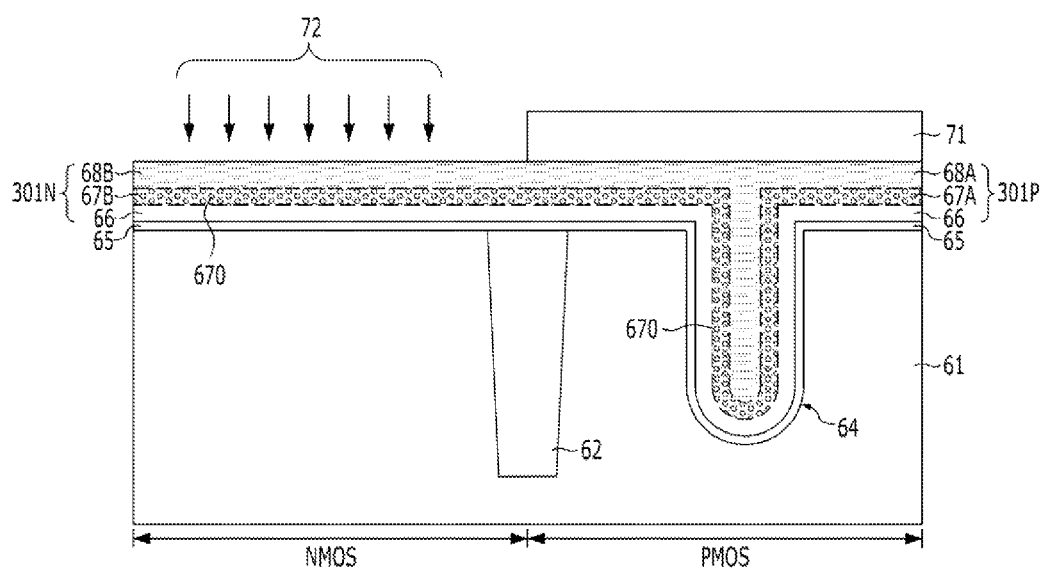
Figure 8E:
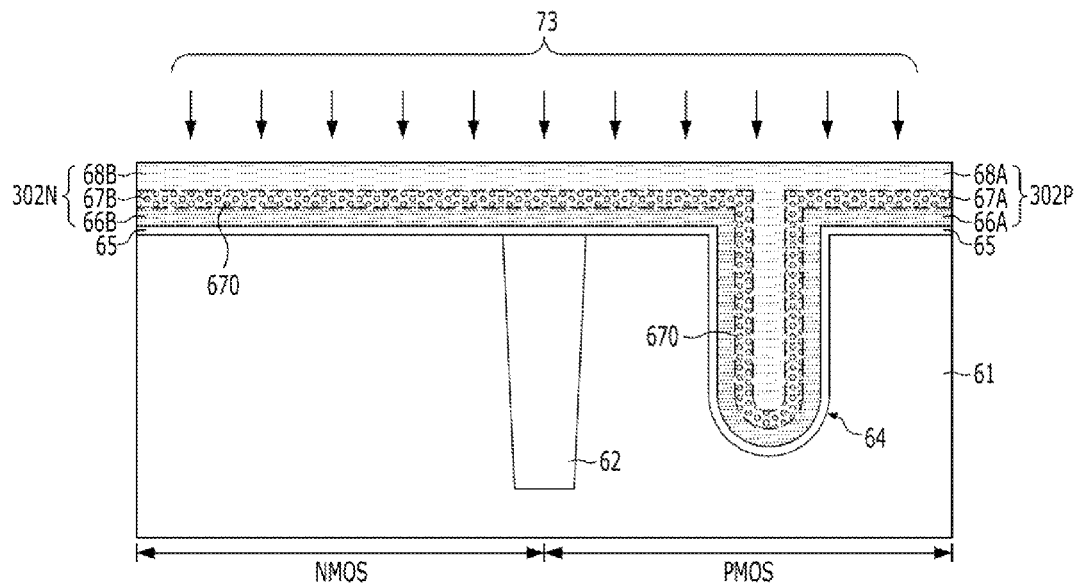

Referring to FIG. 8D, the first mask pattern 69 is removed.

A second mask pattern 71, which covers the second PMOS region, but not the first. NMOS region, is formed on the partially P-type doped silicon-containing layer 301P.

A second impurity doping 72 is performed to dope the first NMOS region with a N-type impurity, such as phosphorus (P). The second impurity doping 72 may use a plasma doping method or an implantation method. For example, $^{31}$P may be used as an impurity source.

In this way, the second impurity doping 72 is performed in the first NMOS region, where a recess is not defined.

By the second impurity doping 72, the third silicon layer 68 and the second silicon layer 67 of the first NMOS region become an N-type doped third silicon layer 68B and an N-type doped second silicon layer 67B. The N-type doped second silicon layer 67B contains the capture species 670. Therefore, a partially N-type doped silicon-containing layer 301N is formed in the first NMOS region.

Referring to FIG. 5E, a first annealing 73 is performed. Accordingly, the P-type impurity is diffused from the P-type doped third silicon layer 68A to the P-type doped second silicon layer 67A and the N-type impurity is diffused from the N-type doped third silicon layer 68B to the N-type doped second silicon layer 67B. Moreover, the impurities accumulated in the P-type doped second silicon layer 67A and N-type doped second silicon layer 67B are diffused to the first silicon layer 66. The diffusion by the first annealing 73 will be referred to as "primary diffusion."

By sequentially performing the first and second impurity doping 70 and 72 and the first annealing 73 as described above, all of the first to third silicon layers are in doped states. Namely, a P-type doped silicon-containing layer 302P is formed in the recess 64. An N-type doped silicon-containing layer 302N is formed in the first NMOS region.

The P-type doped silicon-containing layer 302P includes a P-type doped first silicon layer 66A, a P-type doped second silicon layer 67A, and a P-type doped third silicon layer 68A. The N-type doped silicon-containing layer 302N includes an N-type doped first silicon layer 66B, an N-type doped second silicon layer 67B, and an N-type doped third silicon layer 68B. The P-type and N-type doped second silicon layers 67A and 67B are doped with the impurities and are doped with the capture species 670. The P-type and N-type doped first silicon layers 66A and 66B and the P-type and N-type doped third silicon layers 68A and 68B are only doped with the impurities and are not doped with the capture species. In the case where the doped silicon-containing layer is polysilicon, it becomes a P-type doped polysilicon layer or an N-type doped polysilicon layer, depending on the type of impurity that is used for doping.

Figure 8F:
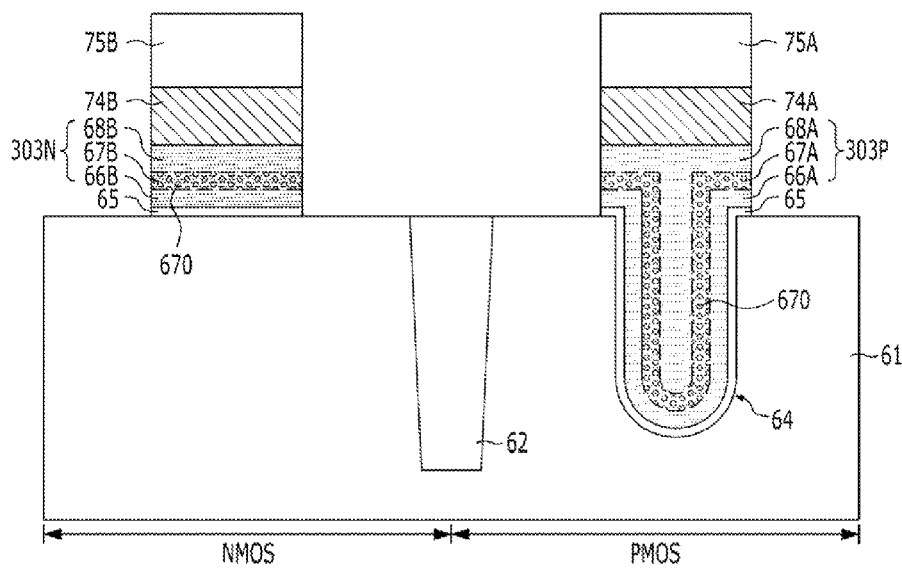

Referring to FIG. 8F, after forming a metal layer and a gate hard mask layer on the P-type and N-type doped silicon-containing layer 302P and 302N, a gate etching process is performed. A planar gate structure is formed in the first NMOS region, and a recess gate structure is formed in the second PMOS region. The planar gate structure, in which an N-type doped silicon-containing electrode 303N, a metal electrode 74B, and a gate hard mask layer 75B are stacked, is formed in the first NMOS region. A recess gate structure, in which a P-type doped silicon-containing electrode 303P, a metal electrode 74A, and a gate hard mask layer 75A are stacked, is formed in the second PMOS region. The P-type doped silicon-containing electrode 303P, formed in recess gate structure, extends into the recess 64. The metal electrodes 74A and 74B may include a low resistance substance. For example, the metal electrodes 74A and 74B may include tungsten or a titanium nitride. The gate hard mask layers 75A and 756 may include a silicon nitride. While not shown, a gate spacer process may be performed after the gate etching process. As gate spacers, a silicon oxide, a silicon nitride, and so forth may be used.

Figure 8G:
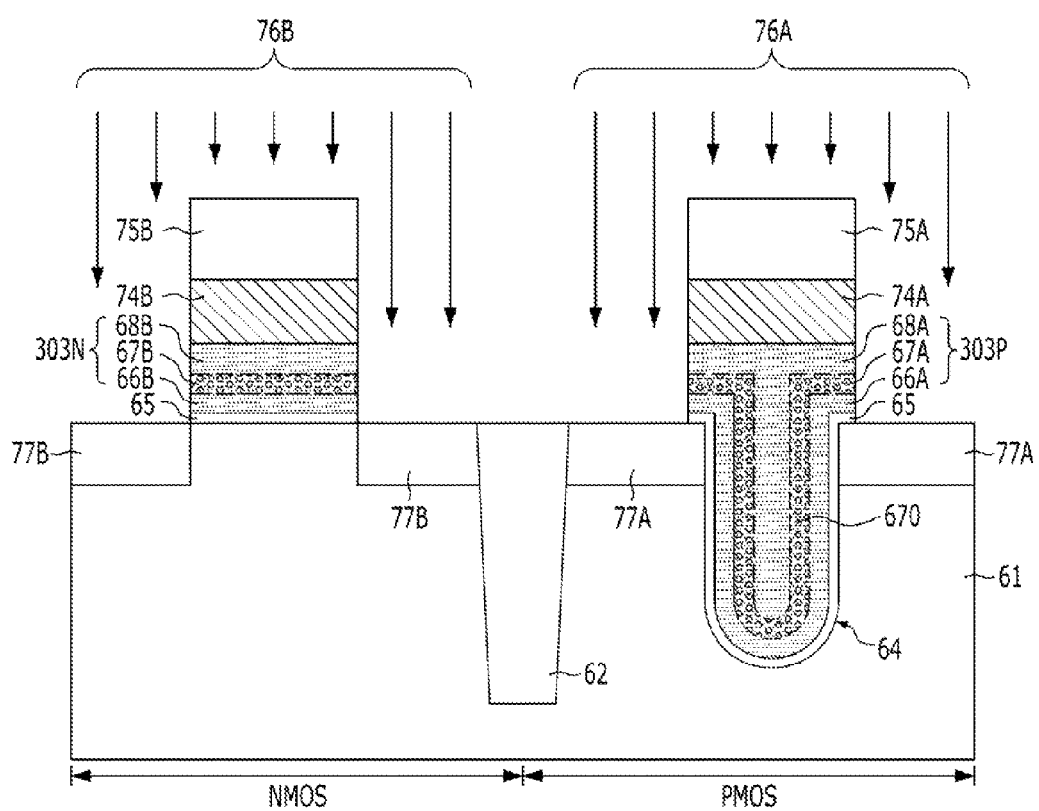

Referring to FIG. 8G, a third doping may be performed. P-type source/drain regions 77A may be formed by doping a P-type impurity, using, for example, ion implantation 76A. N-type source/drain regions 77B may be formed by doping a N-type impurity, using, for example, ion implantation 76B.

Referring to FIG. 8H, a second annealing 78 is performed. The second annealing 78 may include rapid thermal annealing. The second annealing 78 is performed to activate the impurities implanted into the P-type source/drain regions 77A and the N-type source/drain regions 77B.

When performing the second annealing 78, as described above, impurities are diffused from the P-type and N-type doped third silicon layers 68A and 68B to the P-type and N-type doped second silicon layers 67A and 67B, respectively, and impurities are diffused from the P-type and N-type doped second silicon layers 67A and 67B to the P-type and N-type doped first silicon layers 66A and 66B, respectively. The diffusion by the second annealing 78 will be referred to as "secondary diffusion." By the secondary diffusion, impurities are additionally doped into the P-type and N-type doped first silicon layers 66A and 66B.

As a result, after the second annealing 78 is completed, impurities may be uniformly distributed in the P-type doped third silicon layer 68A and the N-type doped third silicon layer 68B, in the P-type second silicon layer 67A and the N-type doped second silicon layer 67B, and in the P-type doped first silicon layer 66A and the N-type doped first silicon layer 66B. In particular, the impurities may be sufficiently doped into to the deep zone of the recess 64, that is, the lower surface of the P-type doped first silicon layer 66A.

As is apparent from the above description, the P-type impurity may be sufficiently doped up to the deep zone of the recess 64 by performing the first impurity doping 70, the first annealing 73 and the second annealing 78, after containing the capture species 670 in the silicon-containing layer 300. That is, the P-type impurity may be accumulated at a predetermined depth even when performing the first impurity doping 70, and diffusion of the P-type impurity may be induced by performing the first annealing 73 and the second annealing 78, by which a sufficiently large amount of the P-type impurity may be doped into the deep zone of the recess 64.

Furthermore, by performing impurity doping using the implantation method, after containing the capture species 670, the P-type impurity may be sufficiently doped into to the deep zone of the recess 64 while suppressing the penetration phenomenon.

Figure 9:
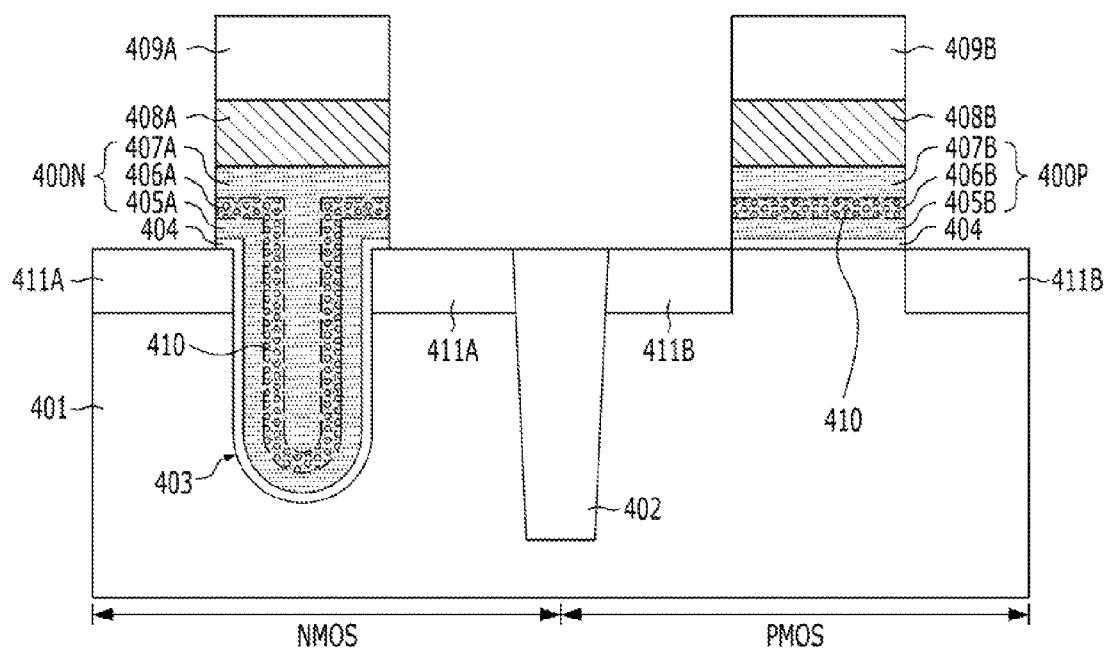
FIG. 9 is a view illustrating a transistor with a recess gate structure in accordance with a fourth embodiment of the present invention.

FIG. 9 is a view illustrating a transistor with a recess gate structure in accordance with a fourth embodiment of the present invention.

Referring to FIG. 9, a semiconductor substrate 401 has a plurality of transistor regions. The plurality of transistor regions may include a first region and a second region. An isolation region 402 is formed to isolate the first region and the second region from each other. The isolation region 402 has a trench structure and may be formed through an STI (shallow trench isolation) process. The isolation region 402 may include a dielectric layer (for example, a silicon oxide). The first region is a region where an NMOS is formed, and the second region is a region where a PMOS is formed. Hereinafter, the first region and the second region will be referred to as the "first NMOS region" and the "second PMOS region," respectively. The positions of the first NMOS region and the second PMOS region are for the sake of convenience in explanation, and may be interchanged with each other. The semiconductor substrate 401 may be formed of, but not limited to, silicon, germanium or silicon and germanium. Furthermore, the entirety or a part of the semiconductor substrate 401 may be strained.

A recess 403 of a predetermined depth is defined in the semiconductor substrate 401 in the first NMOS region. The recess 403 is not defined in the second PMOS region.

A gate dielectric layer 404 is formed on the surface of the recess 403. The gate dielectric layer 404 is also formed on the semiconductor substrate 401 in the second PMOS region.

A recess gate structure, including an N-type silicon-containing electrode 400N that fills the recess 403, is formed on the gate dielectric layer 404 of the first. NMOS region. N-type source/drain regions 411A are formed in the semiconductor substrate 401 on both sides of the recess gate structure.

The recess gate structure formed in the first NMOS region may include a N-type doped silicon-containing electrode 400N, a metal electrode 408A, and a gate hard mask layer 409A. The N-type doped silicon-containing electrode 400N may include a N-type doped first silicon layer 405A, an N-type doped second silicon layer 406A, and an N-type doped third silicon layer 407A. The N-type doped first silicon layer 405A and the N-type doped second silicon layer 406A are conformally formed on the gate dielectric layer 404, and the N-type doped third silicon layer 407A fills the recess 403 in the N-type doped second silicon layer 406A. The N-type doped first to third silicon layers 405A, 406A, and 407A may include polysilicon layers. The N-type doped first to third silicon layers 405A, 406A and 407A are polysilicon layers uniformly doped with an N-type impurity, such as phosphorus. The N-type doped second silicon layer 406A contains a capture species 410. The capture species 410 may include carbon or nitrogen, or a mixture of carbon and nitrogen. In the case of a mixture of carbon and nitrogen, the N-type doped second silicon layer 406A may be formed by stacking a nitrogen-containing zone and a carbon-containing zone.

The planar gate structure formed in the second PMOS region may include a P-type doped silicon-containing electrode 400P, a metal electrode 408B, and a gate hard mask layer 409B. The P-type doped silicon-containing electrode 400P may include a P-type doped first silicon layer 405B, a P-type doped second silicon layer 406B, and a P-type doped third silicon layer 407B. The P-type doped first to third silicon layers 405B, 406B, and 407B may include polysilicon layers that are uniformly doped with a P-type impurity, such as boron. The P-type doped second silicon layer 406B contains a capture species 410. The capture species 410 may include carbon or nitrogen, or a mixture of carbon and nitrogen. In the case of the mixture of carbon and nitrogen, the P-type doped second silicon layer 406B may be formed by stacking a nitrogen-containing zone and a carbon-containing zone. P-type source/drain regions 411B are formed in the semiconductor substrate 401 on both sides of the planar gate structure.

According to FIG. 9, the PMOS includes the planar gate structure, and the NMOS includes the recess gate structure. Moreover, the NMOS includes the N-type doped silicon-containing electrode 400N, and the PMOS includes the P-type doped silicon-containing electrode 400P. Both the N-type doped silicon-containing electrode 400N and the P-type doped silicon-containing electrode 400P contain the capture species 410. Due to the presence of the capture species 410, a sufficiently large amount of the N-type impurities may be doped into the deep zone of the recess 403.

In variations of the fourth embodiment, the capture species 410 may be contained in the N-type and the P-type doped third silicon layers 407A and 407B or may be contained in the N-type and the P-type doped first silicon layers 405A and 405B.

FIGS. 10A to 10H are views illustrating an exemplary method for forming the transistor in accordance with the fourth embodiment of the present invention. In the present embodiment, a method for fabricating a CMOS circuit will be described. It is to be noted that the present invention is not limited to the CMOS circuit. Instead, the present invention may be applied to all semiconductor device fabricating methods for forming an NMOS and a PMOS. Also, the present invention may be applied to each of a method for fabricating an NMOS and a method for fabricating a PMOS. The NMOS and the PMOS are formed in the CMOS circuit. The CMOS circuit includes at least one PMOS or NMOS. The CMOS circuit may constitute a sense amplifier.

Figure 10A:
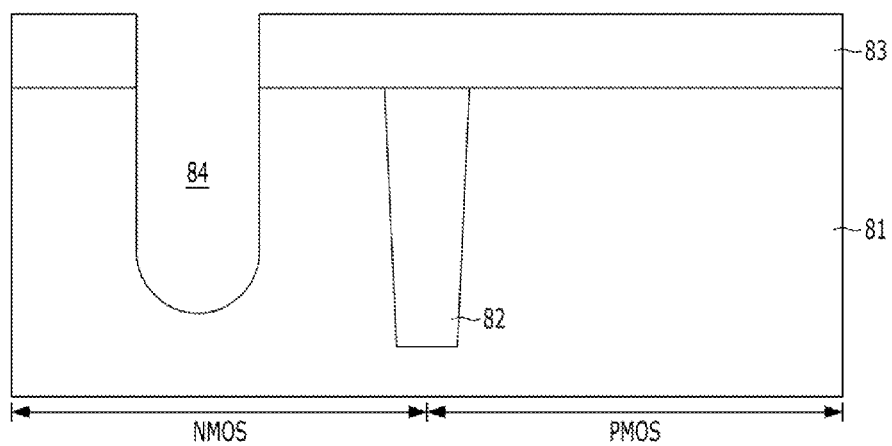
FIGS. 10A to 10H are views illustrating an exemplary method for forming the transistor in accordance with the fourth embodiment of the present invention.

Referring to FIG. 10A, a semiconductor substrate 81 has a plurality of transistor regions. The plurality of transistor regions may include a first region and a second region. An isolation region 82 is formed to isolate the first region and the second region from each other. The isolation region 82 has a trench structure and may be formed through an STI (shallow trench isolation) process. The isolation region 82 may include a dielectric layer (for example, a silicon oxide). The first region is a region where an NMOS is formed, and the second region is a region where a PMOS is formed. Hereinafter, the first region and the second region will be referred to as the "first NMOS region" and the "second PMOS region," respectively. The positions of the first NMOS region and the second PMOS region are for the sake of convenience in explanation, and may be changed with each other. The semiconductor substrate 81 may be formed of, but not limited to, silicon, germanium or silicon and germanium. Furthermore, the entirety or a part of the semiconductor substrate 81 may be strained. Furthermore, while not shown, first wells and second wells may be formed in the first NMOS region and the second PMOS region through a well forming process generally known in the art. First, P-type wells may be formed in the first NMOS region, and second N-type wells may be formed in the second PMOS region. In order to form the N-type second wells, an N-type impurity, such as phosphorus (P) or arsenic (As), may be implanted into the first NMOS region of the semiconductor substrate 81. In order to form the P-type first wells, a P-type impurity, such as boron (B), may be implanted into the second PMOS region of the semiconductor substrate 81. The semiconductor substrate 81 may include a silicon-containing substance. The semiconductor substrate 81 may include a silicon substrate or a silicon-germanium substrate.

A patterned hard mask layer 83 is formed on the semiconductor substrate 81. By etching a portion of the semiconductor substrate 81 in the first NMOS region, using the hard mask layer 83 as an etch barrier, a recess 84 is defined. The hard mask layer 83 may include a silicon oxide, a silicon nitride, or the stack of a silicon oxide and a silicon nitride. Also, the hard mask layer 83 may include a substance with an etching selectivity when etching the semiconductor substrate 81. The recess 84 is defined in the first NMOS region. The recess 84 may have a depth, for example, of approximately 2000 Å that varies according to a channel length. The recess 84 may be defined by dry-etching the semiconductor substrate 81. Accordingly, the bottom of the recess 84 may have a rounded profile. While not shown, after defining the recess 84, an ion implantation of impurities for controlling a threshold voltage (hereinafter, referred to as 'threshold voltage control ion implantation') may be performed. In the threshold voltage control ion implantation, suitable impurities may be selected for the channel of a transistor. Before the threshold voltage control ion implantation, a sacrificial layer (not shown) may be formed on the surface of the recess 84. By forming the sacrificial layer, it is possible to minimize etch damage and/or defects that may be produced while defining the recess 84. The sacrificial layer may be formed using a thermal oxidation process and may be removed after the threshold voltage control ion implantation.

Figure 10B:
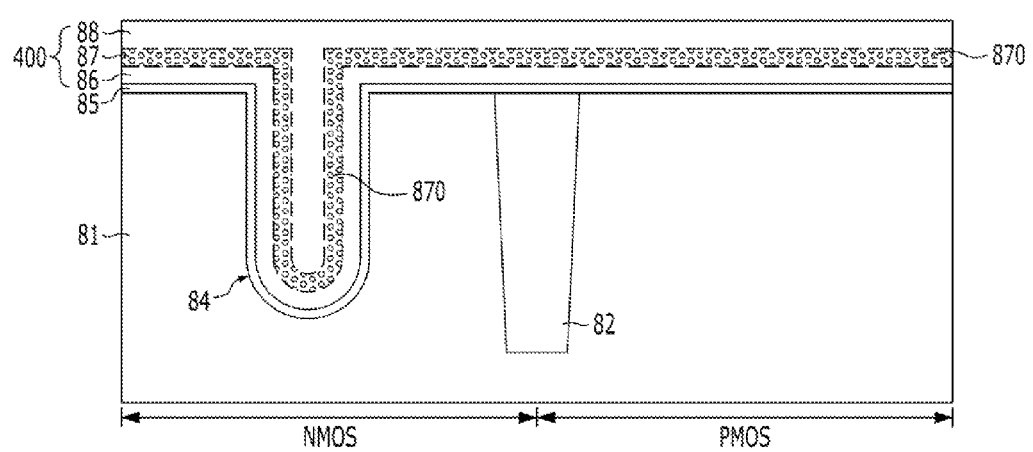

Referring to FIG. 10B, the hard mask layer 83 is removed. A gate dielectric layer 85 is formed on the entire surface of the semiconductor substrate 81, including the surface of the semiconductor substrate 81 that defines the recess 84. The gate dielectric layer 85 may include a silicon oxide, a silicon nitride, or a high dielectric constant (high-k) substance. The gate dielectric layer 85 may be formed through thermal oxidation, plasma oxidation, atomic layer deposition (ALD), chemical vapor deposition (CVD), etc. Subsequently, the gate dielectric layer 85 may be nitridated. The high-k substance includes a substance with a high dielectric constant. The high-k substance generally has a dielectric constant higher than the dielectric constant (of approximately 3.9) of a silicon oxide ($SiO_2$). The high-k substance is substantially thicker physically than the silicon oxide and has a lower equivalent oxide thickness (EOT) value than the silicon oxide. For example, the high-k substance may includes a metal-containing substance, such as a metal oxide or a metal silicate. The metal oxide may include, for example, an oxide containing a metal such as hafnium (Hf), aluminum (Al), lanthanum (La) or zirconium (Zr). The metal oxide may include a hafnium oxide ($HfO_2$), an aluminum oxide ($Al_2O_3$), a lanthanum oxide ($LaO_2$), a zirconium oxide ($ZrO_2$), or a combination thereof. The metal silicate may include a silicate containing a metal, such as hafnium (Hf) or zirconium (Zr). The metal silicate may include a hafnium silicate (HfSiO), a zirconium silicate (ZrSiO), or a combination thereof.

A process for forming the high-k substance may include any suitable deposition technology. For example, chemical vapor deposition (CVD), low-pressure CVD (LPCVD), plasma-enhanced CVD (PECVD), metal-organic CVD (MOCVD), atomic layer deposition (ALD), plasma-enhanced ALD (PEALD), and so forth may be used. In order to form a uniform thin film, plasma-enhanced ALD (PEALD) may be used. The high-k substance may subsequently be exposed to a nitridation process, such as a plasma nitridation process. Accordingly, nitrogen is implanted into the high-k substance. For example, in the case where the high-k substance is a hafnium silicate (HfSiO), a hafnium silicon oxynitride (HfSiON) is formed by the nitridation process. In this way, by implanting nitrogen into a metal silicate, a dielectric constant increases, and it is possible to suppress crystallization of the metal silicate in a subsequent thermal process.

A gate conductive layer is formed on the entire surface of the semiconductor substrate 81, including the gate dielectric layer 85, to fill the recess 84. The gate conductive layer may include a silicon-containing layer 400 that is not doped with impurities. The undoped silicon-containing layer 400 may include at least a capture species 870.

The silicon-containing layer 400 may include multiple silicon layers. The multiple silicon layers may be stacked in order of a lower layer, an intermediate layer and an upper layer. For example, the multiple silicon layers may include a first silicon layer 86, a second silicon layer 87 and a third silicon layer 88.

First, the first silicon layer 86 may include undoped silicon that is not doped with impurities. For example, the first silicon layer 86 may include undoped polysilicon. The first silicon layer 86 may be conformally deposited to a thickness that does not fill the recess 84.

The second silicon layer 87 is formed on the first silicon layer 86. The second silicon layer 87 may be formed of undoped polysilicon in a manner similar to that of the first silicon layer 86. However, unlike the first silicon layer 86, the second silicon layer 87 may include a substance that contains a capture species 870. The second silicon layer 87 may be formed continuously after depositing the first silicon layer 86. Also, the second silicon layer 87 may be deposited contiguous with the first silicon layer 86. The capture species 870 contained in the second silicon layer 87 may include carbon or nitrogen. The capture species 870 serves to capture and store impurities and diffuse them into a surrounding structure during a subsequent annealing. When forming the second silicon layer 87, the capture species 870 is doped into the second silicon layer 87. Accordingly, the second silicon layer 87 is an undoped polysilicon containing the capture species 870. If the concentration of the capture species 870 is too high, a diffusion of impurities may be suppressed. Therefore, the capture species 870 may have a concentration equal to or less than approximately $10^{10}$ atoms/cm$^3$. The capture species 870 may be doped in situ when depositing the second silicon layer 87. When depositing the second silicon layer 87, a carbon-containing gas or a nitrogen-containing gas may be flowed in addition to a silicon source gas. The carbon-containing gas and the nitrogen-containing gas may be simultaneously flowed, and accordingly, the second silicon layer 87 may contain both of carbon and nitrogen as the capture species 870. In another example, after forming a nitrogen-containing zone by first flowing the nitrogen-containing gas, a carbon-containing zone may be formed by flowing the carbon-containing gas.

The third silicon layer 88 is formed on the second silicon layer 87 to fill the recess 84. The third silicon layer 88 may be formed of the same substance as the first and second silicon layers 86 and 87. The third silicon layer 88 may include undoped silicon that is not doped with impurities. The third silicon layer 88 may include undoped polysilicon.

The third silicon layer 88 is planarized. The planarization may be carried out through etch-back or chemical mechanical polishing (CMP).

In this way, the silicon-containing layer 400 is formed as a substance that fills the recess 84. The silicon-containing layer 400 may include a multi-layered structure of undoped polysilicon the multi-layered structure including the second silicon layer 87 that contains the capture species 870. The first to third silicon layers 86, 87 and 88 may be deposited through chemical vapor deposition (CVD) atomic layer deposition (ALD), etc.

The recess 84 is filled by sequentially depositing the first silicon layer 86, the second silicon layer 87, and the third silicon layer 88. Due to the fact that the second silicon layer 87, containing the capture species 870, is formed between the first silicon layer 86 and the third silicon layer 88, a sandwich structure is completed. The first silicon layer 86, the second silicon layer 87, and the third silicon layer 88 may have the same thickness. Alternatively, the first silicon layer 86 and the third silicon layer 88 may have the same thickness and the second silicon layer 87 may thinner than the first and third silicon layers 86 and 88.

Figure 10C:
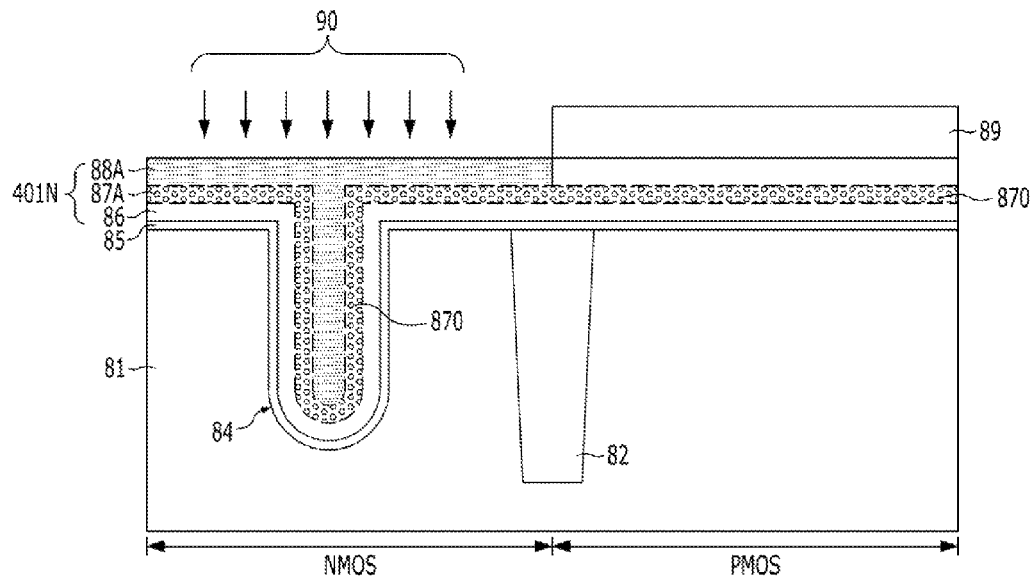

Referring to FIG. 10C, a first mask pattern 89 is formed on the third silicon layer 88 to cover the second PMOS region and open the first NMOS region. That is to say, the first mask pattern 89 is formed to open the NMOS region.

A first impurity doping 90 is performed to dope the first NMOS region with a N-type impurity, such as phosphorus. The first impurity doping 90 may use a plasma doping method or an implantation method. For example, $^{31}$P may be used as an impurity source.

By performing the first impurity doping 90 in this way, impurities are doped into the third silicon layer 88 of the first NMOS region.

When the impurity is doped using the plasma doping method, as energy is increased, a substantial concentration change on a surface does not occur, and only a slope of a concentration distribution based on a doping depth changes so that the doping depth gradually increases. Thus, in the case of increasing energy, the impurity doping concentration of the third silicon layer 88 may be increased in a deep zone of the recess 84 of the first NMOS region. Furthermore, the impurity may be diffused to the second silicon layer 87 underlying the third silicon layer 88. An impurity diffused in this way is captured by the capture species 870 that is contained in the second silicon layer 87, and is accumulated in the second silicon layer 87.

In the case of using the implantation method, the first impurity doping 90 may be performed by setting an Rp (projection range) to a deep zone of the recess 84 of the first NMOS region. Therefore, the impurities are doped into not only the third silicon layer 88, but also into the second silicon layer 87. In particular, when using the implantation method, as penetration is suppressed by the capture species 870 contained in the second silicon layer 87, the impurities are accumulated in the second silicon layer 87. Since a penetration phenomenon is suppressed by the capture species 870, ion implantation energy may be sufficiently increased. Also, a subsequent thermal process may be performed at a high temperature.

In this way, by forming the second silicon layer 87 containing the capture species 870 in the silicon-containing layer 400, an impurity may be accumulated in the second silicon layer 87 when using the plasma doping method or the implantation method. Accordingly, by the first impurity doping 90, the third silicon layer 88, of the first NMOS region, becomes an N-type doped third silicon layer 88A and the second silicon layer 87, of the first NMOS region, becomes an N-type doped second silicon layer 87A. The N-type doped second silicon layer 87A contains the capture species 870. Therefore, a partially N-type doped silicon-containing layer 401N is formed in the first NMOS region.

Figure 10D:
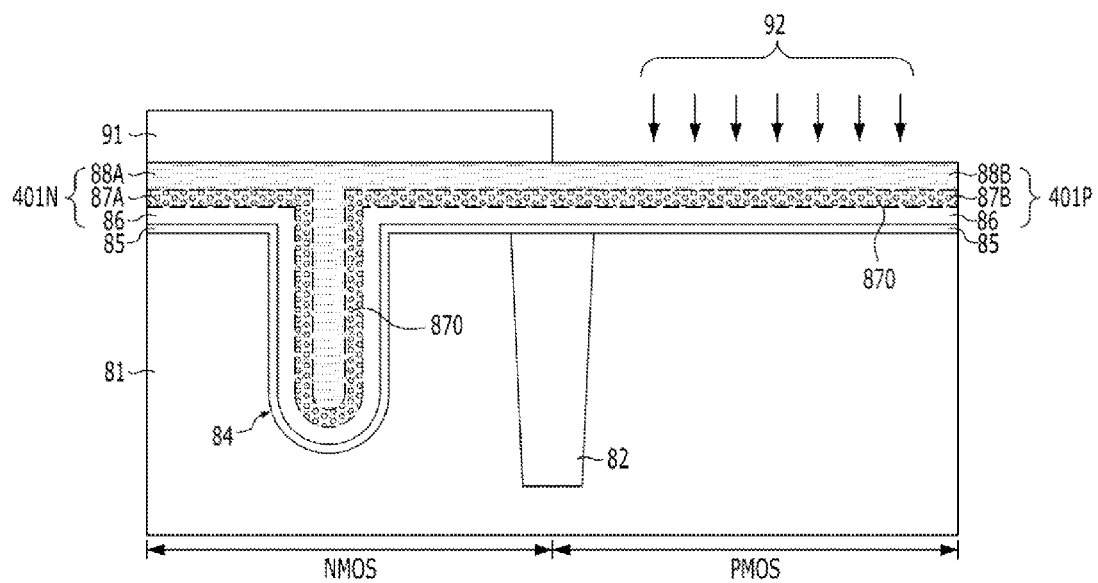

Referring to FIG. 10D, the first mask pattern 89 is removed.

A second mask pattern 91, which covers the first NMOS region, but not the second PMOS region, is formed on the partially N-type doped silicon-containing layer 401N.

A second impurity doping 92 is performed to dope the second PMOS region with a P-type impurity, such as boron.

The second impurity doping 92 may use a plasma doping method or an implantation method. For example, $^{11}$B may be used as an impurity source.

In this way, the second impurity doping 92 is performed in the second PMOS region where a recess is not defined.

By the second impurity doping 92, the third silicon layer 88, of the second PMOS region, becomes a P-type doped third silicon layer 88B and the second silicon layer 87, of the second PMOS region, becomes a P-type doped second silicon layer 87B. The P-type doped second silicon layer 87B contains the capture species 870. Therefore, a partially P-type doped silicon-containing layer 401P is formed in the second PMOS region.

Figure 10E:
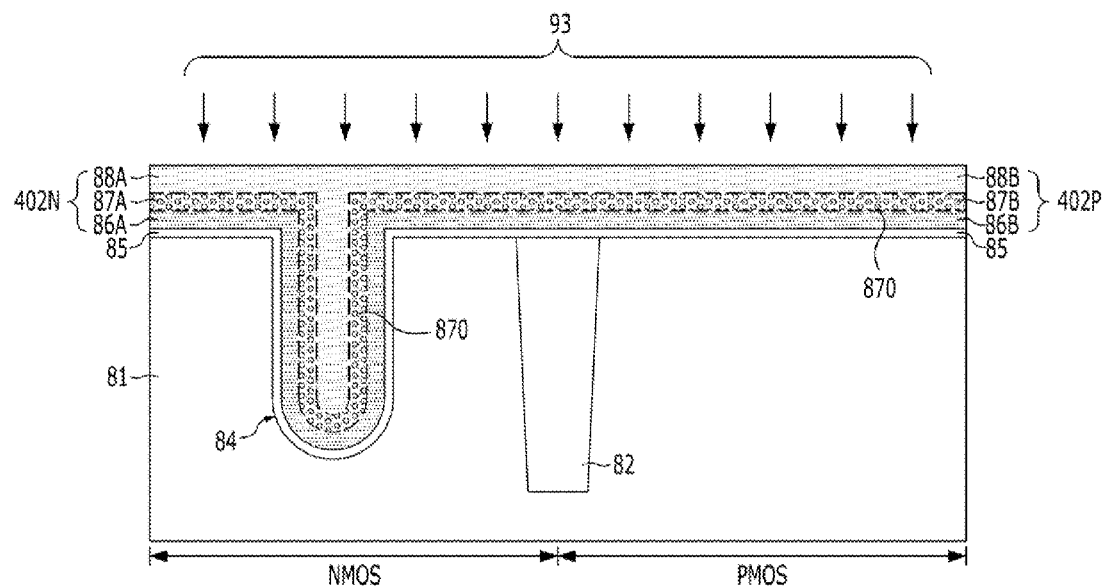

Referring to FIG. 10E, first annealing 93 is performed. Accordingly, impurities are diffused from the N-type doped third silicon layer 88A to the N-type doped second silicon layer 87A and from the P-type doped third silicon layer 88B to the P-type doped second silicon layer 87B. Moreover, the impurities accumulated in the N-type doped second silicon layer 87A and in the P-type doped second silicon layer 87B are diffused to the first silicon layer 86. The diffusion by the first annealing 93 will be referred to as "primary diffusion."

By sequentially performing the first and second impurity doping 90 and 92 and the first annealing 93 as described above, all of the first to third silicon layers are in doped states. Namely, an N-type doped silicon-containing layer 402N is formed in the recess 84.

A P-type doped silicon-containing layer 402P is formed in the second PMOS region. The N-type doped silicon-containing layer 402N may include a N-type doped first silicon layer 86A, a N-type doped second silicon layer 87A, and a N-type doped third silicon layer 88A. The P-type doped silicon-containing layer 402P may include a P-type doped first silicon layer 86B, a P-type doped second silicon layer 87B, and a P-type doped third silicon layer 88B. The N-type doped second silicon layer 87A and the P-type doped second silicon layer 87B are both doped with the impurity and the capture species 870. The N-type doped first silicon layer 86A and the P-type doped first silicon layer and the N-type doped third silicon layers 88A and the P-type doped third silicon layer 88B are doped with an impurity, but are not doped with the capture species. In the case where the doped silicon-containing layer is polysilicon, it becomes a P-type doped polysilicon layer or an N-type doped polysilicon layer according to the type of impurity that is doped.

Figure 10F:
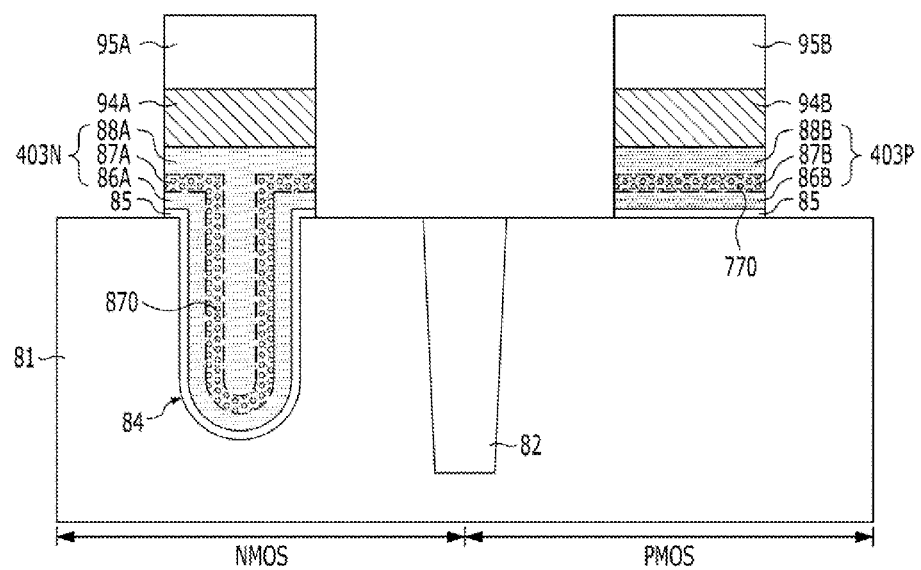

Referring to FIG. 10F, after forming a metal layer and a gate hard mask layer on the N-type and P-type doped silicon-containing layer 402N and 402P, a gate etching process is performed to form a recess gate structure is formed in the first NMOS region, and a planar gate structure in the second PMOS region.

A recess gate structure, in which an N-type doped silicon-containing electrode 403N, a metal electrode 94A, and a gate hard mask layer 95A are stacked, is formed in the first NMOS region. A planar gate structure, in which a P-type doped silicon-containing electrode 403P, a metal electrode 94B, and a gate hard mask layer 95B are stacked, is formed in the second PMOS region. The recess gate structure is configured so that the N-type doped silicon-containing electrode 403N fills the recess 84. The metal electrodes 94A and 94B may include a low resistance substance, such as tungsten or a titanium nitride. The gate hard mask layers 95A and 95B may include a silicon nitride. While not shown, a gate spacer process may be performed after the gate etching process. As gate spacers, a silicon oxide, a silicon nitride, and so forth may be used.

Figure 10G:
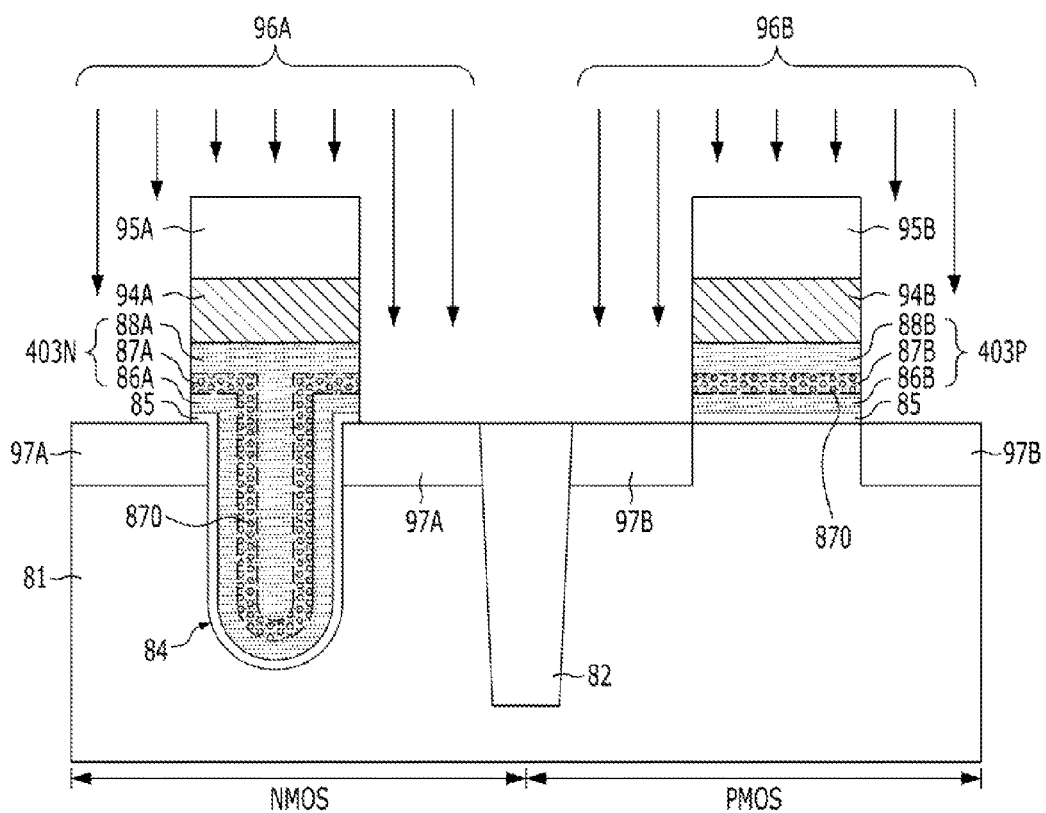

Referring to FIG. 10G, a third doping may be performed. P-type source/drain regions 97B may be formed by doping a P-type impurity, using, for example, ion implantation 96B. N-type source/drain regions 97A may be formed by doping a N-type impurity, using, for example, ion implantation 96A.

Figure 10H:
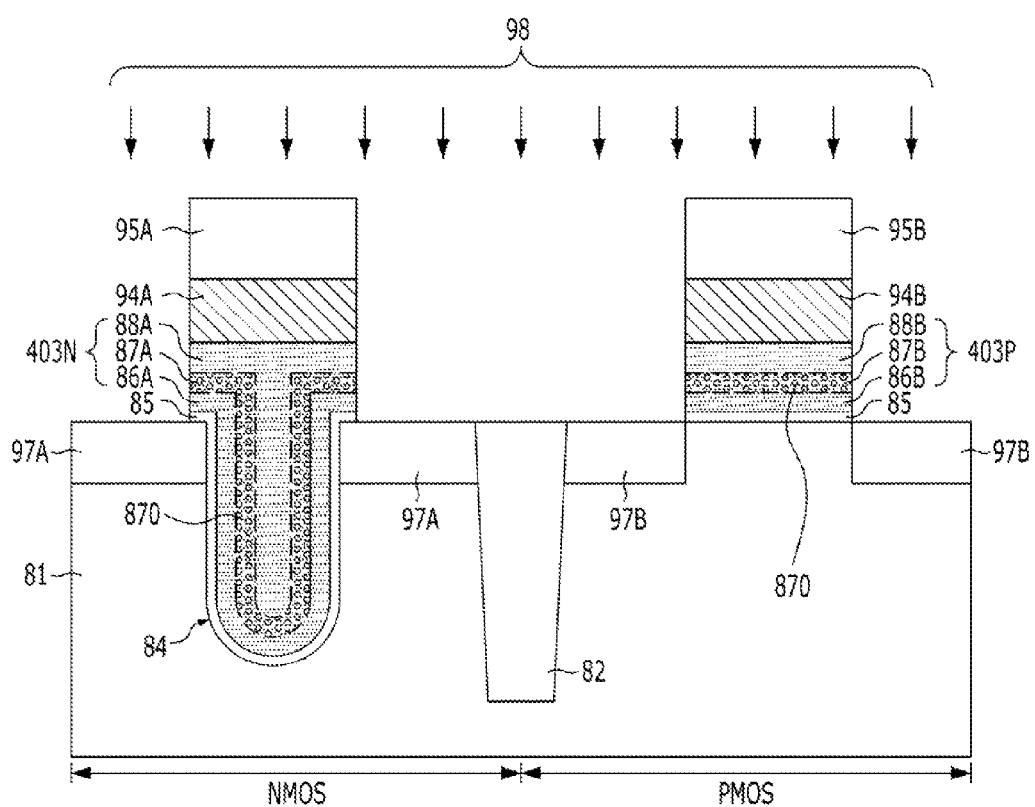

Referring to FIG. 10H, a second annealing 98 is performed. The second annealing 98 may include rapid thermal annealing. The second annealing 98 is performed to activate the impurities doped into the N-type source/drain regions 97A and the P-type source/drain regions 97B.

When performing the second annealing 98, as described above, impurities are diffused from the N-type doped third silicon layer 88A to the N-type doped second silicon layers 87A and from the P-type doped third silicon layer 88B to the P-type doped second silicon layer 87B and impurities are diffused from the N-type doped second silicon layer 87A to the N-type doped first silicon layers 86A and from the P-type doped second silicon layer 87B to the P-type doped first silicon layer 86B. The diffusion by the second annealing 98 will be referred to as "secondary diffusion." By the secondary diffusion, impurities are additionally doped into the N-type and P-type doped first silicon layers 86A and 86B.

As a result, after the second annealing 98 is completed, impurities may be uniformly distributed in the N-type doped third silicon layer 88A and the P-type doped third silicon layer 88B, in the N-type doped second silicon layer 87A and the P-type doped second silicon layer 87B, and in the N-type first silicon layer 86A and the P-type doped first silicon layer 86B. In particular, impurities may be sufficiently doped into the deep zone of the recess 84, that is, the lower surface of the N-type doped first silicon layer 86A.

As is apparent from the above descriptions, by performing the first impurity doping 90, the first annealing 93 and the second annealing 98 after containing the capture species 870 in the silicon-containing layer 400, an N-type impurity may be sufficiently doped into the deep zone of the recess 84. That is, the N-type impurity may be accumulated at a predetermined depth even when performing the first impurity doping 90, and diffusion of impurities may be induced by performing the first annealing 93 and the second annealing 98, by which a sufficiently large amount of the N-type impurity may be doped into the deep zone of the recess 84.

Furthermore, by performing impurity doping using the implantation method after containing the capture species 870, N-type impurities may be sufficiently doped into the deep zone of the recess 84 while suppressing the penetration phenomenon.

As is apparent from the above descriptions, in the embodiments of the present invention, advantages are provided in impurities is formed and then impurity implantation is performed using a plasma doping method, impurities may be sufficiently doped up to a deep zone of a recess.

Also, in the embodiments of the present invention, advantages are provided in that, since a silicon layer containing a capture species for capturing impurities is formed and then impurity implantation is performed using an implantation method, impurities may be sufficiently doped up to a deep zone of a recess while suppressing the occurrence of a penetration phenomenon.

As a consequence, in the embodiments of the present invention, even though the height of a gate electrode increases as in a recess gate structure, the impurity doping efficiency of a silicon-containing electrode may be improved.

While the present invention has been described with respect to the specific embodiments, it will be apparent to those skilled in the art that various changes and modifications may be made without departing from the spirit and scope of the invention as defined in the following claims.

What is claimed is:
1. A method for fabricating a transistor, comprising:
forming a recess in a semiconductor substrate;
forming a gate dielectric layer over the semiconductor substrate;
forming a gate conductive layer including a first undoped silicon layer and a third undoped silicon layer over the gate dielectric layer, the gate conductive layer including an intermediate undoped silicon layer that functions as a capture zone;
doping the gate conductive layer with an impurity after the forming of the gate conductive layer, wherein the impurity is accumulated in the capture zone;
etching the first undoped silicon layer, a third undoped silicon layer, and the intermediate undoped silicon layer to form a recess gate structure; and
diffusing the impurity by performing annealing,
wherein the capture zone included in the recess gate structure contains a capture species comprising at least one of carbon or nitrogen to capture the impurity,
wherein the first undoped silicon layer and the third undoped silicon layer included in the recess gate structure have the same thickness,
wherein the first undoped silicon layer and the intermediate undoped silicon layer included in the recess gate structure are conformally formed not to fill the recess and the third undoped silicon layer included in the recess gate structure is formed over the intermediate undoped silicon layer to fill the recess.

2. The method according to claim 1, wherein the capture zone is formed in the recess.

3. The method according to claim 1, wherein the gate conductive layer comprises a silicon layer.

4. A method for fabricating a transistor, comprising:
forming a recess in a semiconductor substrate;
forming a gate dielectric layer over the semiconductor substrate;
forming, over the gate dielectric layer, a gate conductive layer including a lower silicon layer, an intermediate undoped silicon layer, and an upper silicon layer, wherein the intermediate undoped silicon layer contains a capture species;
doping the gate conductive layer with a first impurity, wherein the first impurity is accumulated in the capture species of the intermediate undoped silicon layer;
diffusing the first impurity accumulated in the intermediate undoped silicon layer to the lower silicon layer by performing annealing; and
etching the lower silicon layer, the intermediate undoped silicon layer and the upper silicon layer to form a recess gate structure,
wherein the lower silicon layer and the intermediate undoped silicon layer included in the recess gate structure are conformally formed not to fill the recess and the upper silicon layer included in the recess gate structure is formed over the intermediate undoped silicon layer to fill the recess,
wherein the lower silicon layer and the upper silicon layer included in the recess gate structure have the same thickness.

5. The method according to claim 4, wherein the intermediate undoped silicon layer is formed in the recess.

6. The method according to claim 4, wherein the capture species comprises at least one of carbon or nitrogen.

7. The method according to claim 4, wherein the forming of the gate conductive layer further comprises:
in situ doping the capture species into the intermediate undoped silicon layer.

8. The method according to claim 4, wherein the lower silicon layer, the intermediate undoped silicon layer, and the upper silicon layer comprise undoped polysilicon.

9. The method according to claim 4, wherein the first impurity comprises boron or phosphorus.

10. The method according to claim 4, further comprising:
forming a metal layer over the gate conductive layer after the first impurity is diffused;
forming a gate structure by etching the metal layer and the gate conductive layer;
forming source/drain regions by doping a second impurity into the semiconductor substrate over both sides of the gate structure; and
diffusing the second impurity in the source/drain regions by performing annealing.

11. A method for fabricating a transistor, comprising:
forming recesses in first and second regions of a semiconductor substrate;
forming a gate dielectric layer over the semiconductor substrate having the recesses;
forming, over the gate dielectric layer, a gate conductive layer in the first region and in the second region, the gate conductive layer including a lower silicon layer, an intermediate undoped silicon layer, and an upper silicon layer, wherein the intermediate undoped silicon layer contains a capture species;
doping the gate conductive layer in the first region with a first impurity, and doping the gate conductive layer in the second region with a second impurity that is different from the first impurity, wherein the first impurity and the second impurity are accumulated in the intermediate undoped silicon layer in the first region and in the second region, respectively;
diffusing the first impurity and the second impurity in the first region and in the second region to the lower silicon layer, respectively, by performing annealing; and
etching the lower silicon layer, the intermediate undoped silicon layer and the upper silicon layer to form a recess gate structure,
wherein the lower silicon layer and the intermediate undoped silicon layer included in the recess gate structure are conformally formed not to fill the recess and the upper silicon layer included in the recess gate structure is formed over the intermediate undoped silicon layer to fill the recess,
wherein the lower silicon layer and the upper silicon layer included in the recess gate structure have the same thickness.

12. The method according to claim 11, wherein the intermediate undoped silicon layer is formed in the recesses.

13. The method according to claim 11, wherein the capture species comprises at least one of carbon or nitrogen.

14. The method according to claim 11, wherein the forming of the gate conductive layer further comprises:
in-situ doping the capture species into the intermediate undoped silicon layer.

15. The method according to claim 11, wherein the first impurity comprises boron, and the second impurity comprises phosphorus.

16. The method according to claim 11, wherein the lower layer, the intermediate undoped silicon layer and the upper layer comprise undoped polysilicon.

17. The method according to claim 11, wherein the first region is a PMOS region, and the second region is an NMOS region.

18. The method according to claim 11, further comprising:
forming a metal layer over the gate conductive layer after diffusing the first impurity and the second impurity;
forming a gate structure by etching the metal layer and the gate conductive layer;
forming source/drain regions by doping a third impurity into the semiconductor substrate over both sides of the gate structure; and
diffusing the third impurity in the source/drain regions by performing annealing.

19. A method for fabricating a transistor, the method comprising:
forming a gate dielectric layer over a semiconductor substrate that includes a first region that defines a recess and a second region having a planar surface;
forming, over the gate dielectric layer, a gate conductive layer in the first region and in the second region, the gate conductive layer including a lower silicon layer, an intermediate undoped silicon layer, and an upper silicon layer, wherein the intermediate undoped silicon layer contains a capture species;
doping the gate conductive layer in the first region with a first impurity, and doping the gate conductive layer in the second region with a second impurity that is different from the first impurity, wherein the first impurity and the second impurity are accumulated in the intermediate undoped silicon layer in the first region and in the second region, respectively;
diffusing the first impurity and the second impurity in the first region and in the second region, respectively, by performing annealing; and,
etching the lower silicon layer, the intermediate undoped silicon layer and the upper silicon layer to form a recess gate structure
wherein the capture species comprises at least one of carbon or nitrogen to capture the impurity,
wherein the lower silicon layer and the intermediate undoped silicon layer included in the recess gate structure are conformally formed not to fill the recess and the upper silicon layer included in the recess gate structure is formed over the intermediate undoped silicon layer to fill the recess,
wherein the lower silicon layer and the upper silicon layer included in the recess gate structure have the same thickness.

20. The method according to claim 19, wherein the intermediate undoped silicon layer in the first region is formed in the recess.

21. The method according to claim 19, further comprising:
forming a metal layer over the gate conductive layer after diffusing the first impurity and the second impurity;
forming a recess gate structure and a planar gate structure in the first region and in the second region, respectively, by etching the metal layer and the gate conductive layer;
forming source/drain regions by doping a third impurity into the semiconductor substrate over both sides of the recess gate structure and the planar gate structure; and
diffusing the third impurity in the source/drain regions by performing annealing.

22. A semiconductor device, comprising:
a semiconductor substrate including a plurality of transistor regions;
a recess defined in at least one of the plurality of transistor regions;
a gate dielectric layer formed over the semiconductor substrate having the recess; and
a recess gate structure, formed in the recess and over the gate dielectric layer, the recess gate structure including a lower silicon layer, an intermediate undoped silicon layer, and an upper silicon layer, wherein the intermediate undoped silicon layer contains a capture species to accumulate an impurity doped into the recess gate structure,
wherein the capture species comprises at least one of carbon or nitrogen,
wherein the lower silicon layer and the intermediate undoped silicon layer included in the recess gate structure are conformally formed not to fill the recess and the upper silicon layer included in the recess gate structure is formed over the intermediate undoped silicon layer to fill the recess,
wherein the lower silicon layer and the upper silicon layer included in the recess gate structure have the same thickness.

23. The semiconductor device according to claim 22, wherein the intermediate undoped silicon layer is positioned in the recess.

24. The semiconductor device according to claim 22, wherein the lower silicon layer, the intermediate undoped silicon layer, and the upper silicon layer comprise polysilicon layers that are doped with boron or phosphorus.

25. The semiconductor device according to claim 22, wherein the recess gate structure comprises a gate structure of a CMOS circuit.

26. The semiconductor device according to claim 22, further comprising:
a planar gate structure formed over the gate dielectric layer, the planar gate structure including the lower silicon layer, the intermediate undoped silicon layer, and the upper silicon layer, wherein the intermediate undoped silicon layer contains a capture species to accumulate an impurity doped into the planar gate structure.

* * * * *